(12) United States Patent
Okamoto et al.

(10) Patent No.: US 8,098,972 B2
(45) Date of Patent: Jan. 17, 2012

(54) REPRODUCED SIGNAL PROCESSOR AND VIDEO DISPLAY

(75) Inventors: Kouji Okamoto, Osaka (JP); Akira Yamamoto, Osaka (JP); Hiroki Mouri, Osaka (JP); Yoshinori Shirakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 382 days.

(21) Appl. No.: 12/526,746

(22) PCT Filed: Nov. 1, 2007

(86) PCT No.: PCT/JP2007/071336
§ 371 (c)(1),
(2), (4) Date: Aug. 11, 2009

(87) PCT Pub. No.: WO2008/129708
PCT Pub. Date: Oct. 30, 2008

(65) Prior Publication Data
US 2010/0020250 A1    Jan. 28, 2010

(30) Foreign Application Priority Data
Apr. 5, 2007    (JP) .................. 2007-099212

(51) Int. Cl.
*H04N 5/932* (2006.01)
*H04N 5/935* (2006.01)
(52) U.S. Cl. ........................... 386/201; 386/202

(58) Field of Classification Search .......... 386/200–204, 386/207–208
See application file for complete search history.

(56) References Cited

U.S. PATENT DOCUMENTS
6,792,063 B1    9/2004    Ogura
2009/0060451 A1    3/2009    Mouri et al.

FOREIGN PATENT DOCUMENTS
| | | |
|---|---|---|
| JP | 08-007489 | 1/1996 |
| JP | 08-161829 | 6/1996 |
| JP | 2002-008315 | 1/2002 |
| JP | 4124798 | 7/2008 |
| WO | WO 00/36602 | 6/2000 |
| WO | WO 2007/007421 A1 | 1/2007 |
| WO | WO 2007/060765 A1 | 5/2007 |

*Primary Examiner* — Thai Tran
*Assistant Examiner* — Nigar Chowdhury
(74) *Attorney, Agent, or Firm* — McDermott Will & Emery LLP

(57) ABSTRACT

In a feedforward control type reproduced signal processor, a clock generator 1 changes a clock frequency, depending on a digital value set by a digital value generator 7. Therefore, power consumption of a system is optimized and control is facilitated. Moreover, when a frequency lock state is established in which a frequency ratio calculated by a frequency ratio calculator 3 satisfies a set condition, a modulation component having a small change is generated using a clock of a clock generator 1. Therefore, the digital value is updated with the modulation component, so that a change in clock frequency of the clock generator 1 gradually varies. As a result, the influence of the change in clock frequency on the response of a decoding process is reduced.

15 Claims, 22 Drawing Sheets

REPRODUCED SIGNAL PROCESSOR AND VIDEO DISPLAY

RELATED APPLICATIONS

This application is the U.S. National Phase under 35 U.S.C. §371 of International Application No. PCT/JP2007/071336, filed on Nov. 1, 2007, which in turn claims the benefit of Japanese Application No. 2007-099212, filed on Apr. 5, 2007, the disclosures of which Applications are incorporated by reference herein.

TECHNICAL FIELD

The present invention relates to a reproduced signal processor requiring a function of extracting timing information contained in a reproduced signal read out from a recording medium, such as mainly an optical disc or the like, from the reproduced signal, and a video display including the reproduced signal processor.

BACKGROUND ART

In conventional reproduced signal processors, in order to extract a clock synchronous with recorded data, an input reproduced signal is quantized by an A/D converter, a frequency error and a phase error are calculated by a digital circuit based on the quantized data, the digital correction amounts are converted into analog values by a D/A converter, and oscillation frequency control of a VCO (voltage controlled oscillator) is performed (see, for example, Patent Document 1). FIG. 20 shows a block configuration of a feedback timing extractor. By performing such feedback control, a clock for driving the A/D converter and the digital portion is synchronized with a reproduced signal. Regarding decoding of data, since the clock and the quantized data can be synchronized, a decoding process can be performed based on this data.

In contrast to this, a reproduced signal processor employing a feedforward control scheme using a frequency synthesizer which is operated at a fixed rate has also been discussed in, for example, Patent Document 2. FIG. 21 shows a block configuration of the feedforward scheme. In this scheme, an A/D converter which quantizes a reproduced signal with a clock having a constant cycle (fixed rate) is used, an edge position of a synchronous clock is estimated based on a quantized digital data sequence and the fixed-rate clock, and the quantized data is interpolated, and also, the fixed CLK is thinned to generate a pseudo-synchronous clock Data CLK which is pseudo-synchronous therewith, and a decoding process is performed using these pieces of data and the pseudo-synchronous clock.

Patent Document 1: Japanese Unexamined Patent Application Publication No. 2002-8315
Patent Document 2: Japanese Unexamined Patent Application Publication No. H08-161829

DISCLOSURE OF THE INVENTION

Problems to be Solved by the Invention

However, in the conventional feedback configuration described in Patent Document 1, when high-speed reproduction is required, the digital circuit needs to be provided with a pipeline register for timing compensation, resulting in an increase in clock latency. Therefore, the feedback configuration has a drawback that the stability of a loop is likely to be impaired. Also, when the synchronous clock is extracted, a process of frequency pull-in, phase pull-in and phase tracking is required in time series, and data synchronization is established after start of the phase tracking operation as shown in FIG. 22. Therefore, it disadvantageously takes a long time until the synchronous clock required to extract synchronized data becomes stable.

In contrast to this, the feedforward control is a method of calculating a correction amount from a quantized data sequence, and performing a correction process with respect to the already quantized data sequence, and therefore, is not affected by clock latency, and is suitable for high-speed reproduction.

However, the feedforward control method requires a clock which invariably operates at a fixed rate (typically, a frequency synthesizer or the like is used for this clock generation), and it is assumed that the frequency of this clock provides oversampling with respect to the channel frequency (channel rate) of a reproduced signal. Therefore, once the channel frequency (channel rate) of a reproduced signal is determined, a clock which operates at a fixed rate needs to be set to a frequency higher than the channel frequency. Therefore, when the channel frequency (channel rate) of a reproduced signal varies with time or when random seek access occurs, the fixed rate clock is set to a frequency higher than the largest value of the channel frequency (channel rate) of the reproduced signal. When the fixed rate clock is thus set to a frequency higher than the largest value of the channel frequency, then if reproduction speed is high, a timing interval in which the fixed clock is thinned is narrow (the number of removed clocks is small) and an increase in power consumption is small, and on the other hand, then if reproduction speed is low and the channel frequency (channel rate) of a reproduced signal is low, oversampling is performed to an extent larger than necessary, and therefore, an interval in which the fixed clock is thinned is broad (the number of removed clocks is large), so that the digital circuit is operated at speed higher than necessary, leading to an increase in power consumption of the system, which can be seen from FIG. 23 showing a relationship between the fixed clock CLK of FIG. 21 and the pseudo-synchronous clock Data CLK when reproduction speed continuously varies.

Moreover, in the case of the feedforward control, when a digital waveform equalizer which is operated with a constant clock is connected to the output side of the A/D converter, it is necessary to change settings, such as a coefficient of the waveform equalizer or the like, depending on the reproduction rate, disadvantageously resulting in complicated control. Also, when a frequency synthesizer is used, then if the oscillation frequency of the output clock of the frequency synthesizer itself is changed so as to follow a steep change in frequency, a response may be slow.

Solution to the Problems

Therefore, a proposal is considered in which, for example, a reproduced signal processor performing feedforward control is employed to improve stability against an increase in clock latency and speed up data synchronization as compared to the feedback control method, and moreover, in the feedforward control, the frequency of a generated clock is variably controlled, so that even if the channel frequency (channel rate) of a reproduced signal varies with time, the frequency of a clock which is invariably generated corresponding to the variation with time is set to a slightly higher oversampling state than the channel frequency of the reproduced signal, whereby the digital circuit is prevented from being operated at speed higher than necessary, so that an increase in power consumption is prevented.

However, in the aforementioned proposal, when the frequency of a clock to be generated to be finely adjusted in a state in which the frequency of the clock to be generated provides slightly higher oversampling than the channel frequency of a reproduced signal, then if a decoding process system which performs a correction process with respect to a quantized data sequence with the adjusted clock has a low level of stability, the fine adjustment of the clock frequency is likely to cause a failure in a decoding process which is satisfactorily operated before the fine adjustment of the clock frequency.

The present invention is provided to solve such a problem. An object of the present invention is to provide a reproduced signal processor which is of feedforward control type and allows fine adjustment of a clock frequency to be performed while maintaining a satisfactory decoding process even when a decoding process system has a low level of stability.

To achieve the object, in the present invention, when a clock frequency is finely adjusted, a change in the clock frequency can be caused to be considerably small, whereby a satisfactory decoding process is maintained.

Specifically, the present invention provides a reproduced signal processor for extracting recording timings from a reproduced signal, including a clock generating circuit for outputting a clock having a frequency corresponding to a set digital value, a quantization circuit for quantizing and outputting the reproduced signal at timings of the output clock of the clock generating circuit, a frequency ratio calculating circuit for calculating a frequency ratio between a reproduction frequency of the reproduced signal and a frequency of the output clock of the clock generating circuit based on the reproduced signal quantized by the quantization circuit, a phase correction value calculating circuit for calculating a phase correction value based on the reproduced signal quantized by the quantization circuit, a pseudo-synchronous clock generating circuit for generating a pseudo-synchronous clock pseudo-synchronous with the recording timings and a phase of the pseudo-synchronous clock, depending on the frequency ratio calculated by the frequency ratio calculating circuit and the phase correction value calculated by the phase correction amount calculating circuit, and a modulation circuit for generating a modulation component using the output clock of the clock generating circuit and updating the set digital value with the modulation component, when the frequency ratio of the frequency ratio calculating circuit satisfies a preset condition.

In the reproduced signal processor of the present invention, the modulation circuit generates the modulation component so that the set digital value gradually varies, when the frequency ratio of the frequency ratio calculating circuit satisfies the preset condition.

The reproduced signal processor of the present invention includes an equalization circuit provided between the quantization circuit and the frequency ratio calculating circuit, for equalizing the reproduced signal quantized by the quantization circuit. The reproduced signal equalized by the equalization circuit is output to the frequency ratio calculating circuit.

In the reproduced signal processor of the present invention, the frequency ratio calculating circuit measures a specific pattern contained in an output sequence of the quantization circuit, an appearance interval of the specific pattern, or both thereof based on the output clock of the clock generating circuit, and calculates the frequency ratio between the reproduction frequency of the reproduced signal and the frequency of the output clock of the clock generating circuit based on the measured value.

In the reproduced signal processor of the present invention, the preset condition is determined by comparing a value of the frequency ratio with a predetermined value after frequency lock in which the frequency ratio is stable is detected based on the frequency ratio.

In the reproduced signal processor of the present invention, the preset condition is determined by determining whether or not a value of the frequency ratio falls within a predetermined range after frequency lock in which the frequency ratio is stable is detected based on the frequency ratio.

In the reproduced signal processor of the present invention, a modulation rate of the modulation circuit is set, depending on the set digital value.

In the reproduced signal processor of the present invention, the frequency lock is detected based on a variation in output of the frequency ratio calculating circuit.

In the reproduced signal processor of the present invention, when frequency lock in which the frequency ratio is stable is not detected, then if the frequency of the output clock of the clock generating circuit is lower than the reproduction frequency of the reproduced signal, the set digital value is set and controlled to a value corresponding to the frequency ratio of the frequency ratio calculating circuit or a value obtained by adding a predetermined offset to the value corresponding to the frequency ratio so that the frequency of the output clock of the clock generating circuit becomes higher than the reproduction frequency of the reproduced signal.

In the reproduced signal processor of the present invention, when frequency lock in which the frequency ratio is stable is no longer detected during reproduction, then if a ratio of the frequency of the output clock of the clock generating circuit to the reproduction frequency of the reproduced signal is higher than a preset range, the set digital value is set and controlled to the frequency ratio of the frequency ratio calculator, or a value obtained by subtracting a predetermined offset from a value corresponding to the frequency ratio so that the ratio of the frequency of the output clock of the clock generating circuit to the reproduction frequency of the reproduced signal falls within the preset range.

In the reproduced signal processor of the present invention, the modulation circuit holds a value of the modulation component to be generated, when frequency lock in which the frequency ratio is stable is no longer detected during reproduction.

In the reproduced signal processor of the present invention, the clock generating circuit includes a combination of a D/A converter and a voltage controlled oscillator, or a current control oscillator.

The present invention also provides a video display includes an LSI having the aforementioned reproduced signal processor and a signal processing circuit for decoding a received signal containing audio data and video data based on a result obtained by the reproduced signal processor, and a display terminal for receiving the decoded signal from the LSI and generating the decoded audio data and displaying the decoded video data.

In the reproduced signal processor of the present invention, the reproduced signal is supplied via a wireless communication path or a communication path including an optical fiber, a coaxial cable or a power line.

In the reproduced signal processor of the present invention, the reproduced signal is supplied from an optical disc including a DVD disc, a CD disc or a Blu-ray disc.

Thus, the present invention provides the feedforward control reproduced signal processor which provides improved stability against an increase in clock latency and higher-speed data synchronization as compared to the feedback control scheme. Moreover, a clock generating circuit changes the clock frequency, depending on the set digital value, whereby power consumption of the system can be optimized and control can be facilitated. In addition, when a frequency lock state is established in which a frequency ratio calculated by the frequency ratio calculating circuit satisfies a set condition, a modulation component is generated using the clock of the clock generating circuit. Therefore, if a change in the modulation component is caused to be considerably small and the digital value is updated with the modulation component, a change in clock frequency of the clock generating circuit gradually varies. As a result, the influence of the change in clock frequency on the response of a decoding process is reduced, so that a satisfactory decoding process is maintained.

Effect of the Invention

As described above, according to the present invention, a feedforward control reproduced signal processor is provided which can optimize power consumption of a system and facilitate control while improving stability against an increase in clock latency and speeding up data synchronization as compared to the feedback control scheme. Moreover, a clock frequency can be finely adjusted while maintaining a satisfactory decoding process.

BRIEF DESCRIPTION OF THE DRAWINGS

FIG. 20 is a block diagram showing a configuration of a feedback timing extractor used in a conventional optical disc reproduction apparatus or the like.

FIG. 21 is a block diagram showing a configuration of a feedforward timing extractor used in a conventional optical disc reproduction apparatus or the like.

DESCRIPTION OF THE REFERENCE CHARACTERS

Figure 1:
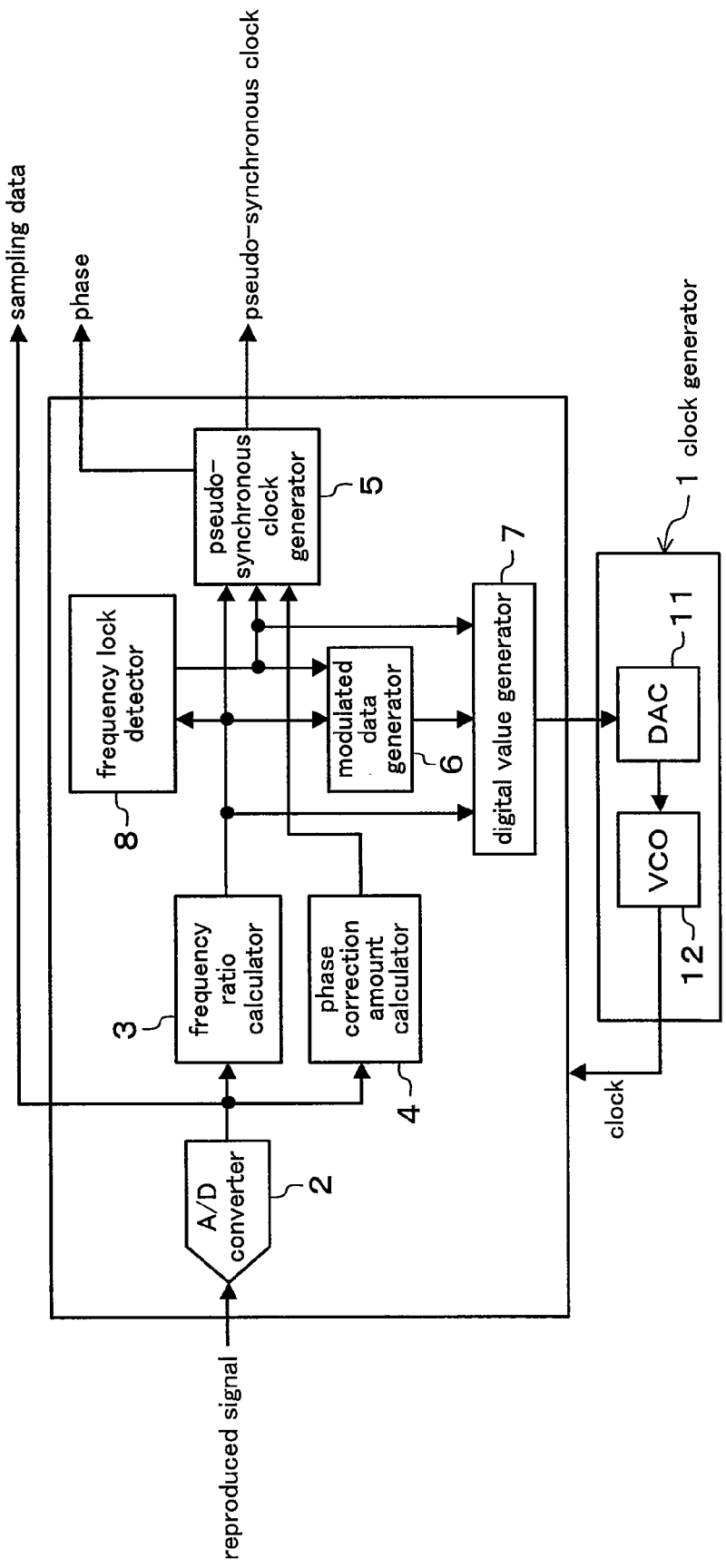
FIG. 1 is a block diagram showing a reproduced signal processor according to a first embodiment of the present invention.

1 clock generator (clock generating circuit)
2 A/D converter (quantization circuit)
3 frequency ratio calculator (frequency ratio calculating circuit)
4 phase correction amount calculator (phase correction value calculating circuit)
6 pseudo-synchronous clock generator (pseudo-synchronous clock generating circuit)
6 modulated data generator (modulation circuit)
7 digital value generator
8 frequency lock detector
9 waveform equalizer (equalization circuit)
11 D/A converter
12 VCO (voltage controlled oscillator)
31 sync mark detector
32 divider
33, 632, 73 set value
51 smoothing filter
52, 515, 633, 636, 643, 75, 77 adder
53 edge generating circuit
54 AND circuit
61, 71 determinator
62 base timing generator
63, 631 modulation timing generator
76 register
64, 641 output unit
101 information recording unit
102 information reading unit
103 LSI
511, 634, 642, 644, 74 selector
512, 513, 72 gain controller
514 integrator
610 subtractor
611, 612, 617, 618 selector
613, 619 register
614, 616 logic calculation circuit 615 comparator
621 counter
622 comparator
623 lookup table
635, 637, 645 register

BEST MODE FOR CARRYING OUT THE INVENTION

Hereinafter, embodiments of the present invention will be described in detail with reference to the accompanying drawings.

Embodiment 1

FIG. 1 is a block diagram showing a timing extractor according to a first embodiment of the present invention. The timing extractor of this embodiment is, for example, one used in an information reproduction apparatus which extracts recorded data and its data recording timings from an analog reproduced signal obtained when data recorded in a recording medium, such as an optical disc or the like, is reproduced.

In FIG. 1, reference numeral 1 indicates a clock generator (clock generating circuit) which includes a D/A converter 11 and a voltage controlled oscillator (VCO) 12. Note that the clock generator 1 is not limited to this configuration and may include a current controlled oscillator. Reference numeral 2 indicates an A/D converter (quantization circuit), reference numeral 3 indicates a frequency ratio calculator (frequency ratio calculating circuit), reference numeral 4 indicates a phase correction amount calculator (phase correction amount calculating circuit), reference numeral 5 indicates a pseudo-synchronous clock generator (pseudo-synchronous clock generating circuit), reference numeral 6 indicates a modulated data generator (modulation circuit), reference numeral 7 indicates a digital value generator, and reference numeral 8 indicates a frequency lock detector. Hereinafter, a detailed configuration and operation of each part will be described.

The A/D converter 2 performs sampling with respect to an input reproduced signal based on a clock output by the clock generator 1 to quantize and output the reproduced signal.

The frequency ratio calculator 3 measures a specific pattern, an appearance interval of the specific pattern, or both of them from an output sequence of the A/D converter 2, based on the clock output by the clock generator 1, and calculates a frequency ratio between a channel frequency (channel rate) of the reproduced signal and a frequency of the output clock of the clock generator 1 based on the measured value. As the specific pattern, for example, a sync mark is used when the reproduced signal is of DVD, Blu-ray disc, or CD.

Figure 2:
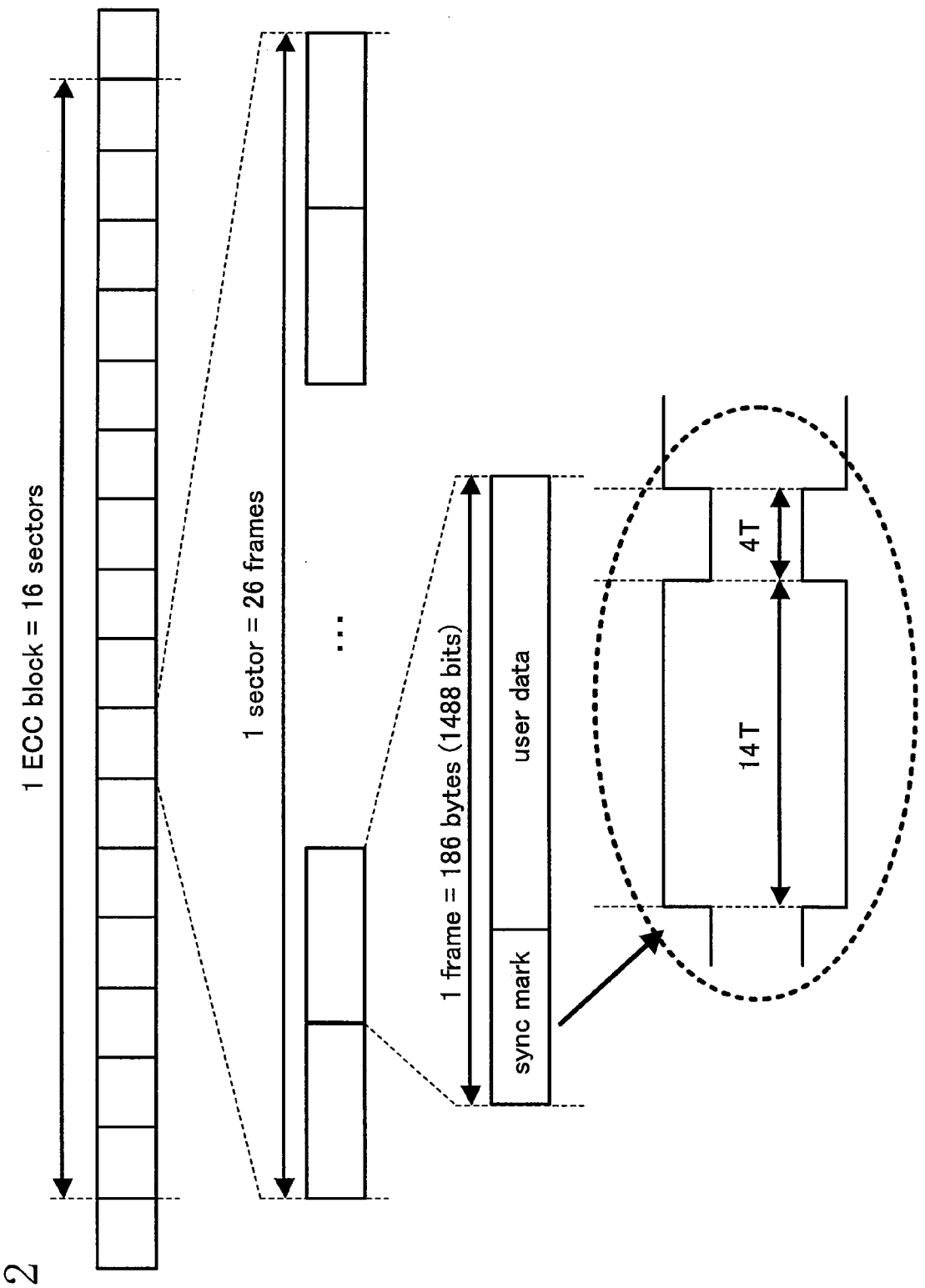
FIG. 2 is a diagram showing a data format of a DVD-ROM.

FIG. 2 shows a data format of a DVD-ROM. Data recorded on a DVD-ROM includes ECC (Error Correction Coding) blocks. Each ECC block includes 16 sectors each of which includes 26 frames. Each frame includes data of 1488 channel bits. A sync mark is inserted in a header portion of each frame. The sync mark is a specific pattern having a predetermined bit interval. In the case of a DVD-ROM, the sync mark includes 14 consecutive channel bits "1" and 4 consecutive channel bits "0," or 14 consecutive channel bits "0" and 4 consecutive channel bits "1." In this case, the sync mark appears every 1488 channel bits. Note that, when the sync mark is of CD, the sync mark includes 11 consecutive channel bits "0" and 11 consecutive channel bits "1," or its complementary combination, and appears every 588 channel bits. The sync mark of Blu-ray includes 2 consecutive channel bits "0," 9 consecutive channel bits "1" and 9 consecutive channel bits "0," or its complementary combination, and appears every 1932 channel bits. Such a sync mark is a pattern which does not appear in user data. Therefore, by utilizing the sync mark, the frequency ratio between the channel frequency (channel rate) of a reproduced signal and the frequency of the output clock of the clock generator 1 can be easily calculated.

Figure 3:
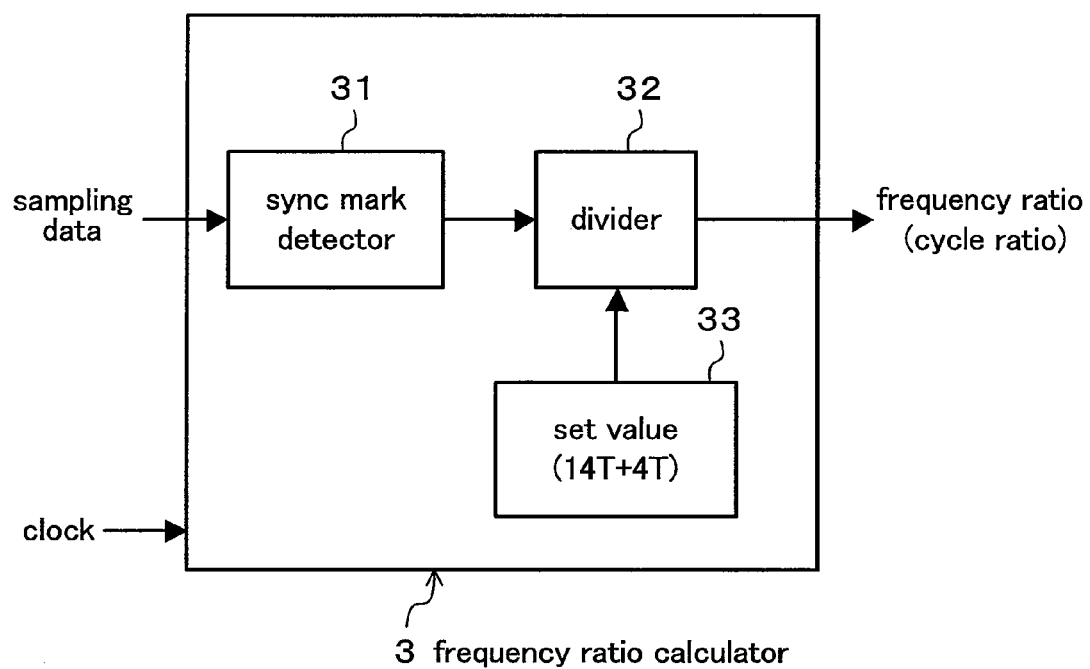
FIG. 3 is a diagram showing an example configuration of a frequency ratio calculator included in the reproduced signal processor of the first embodiment.

FIG. 3 shows an example configuration of the frequency ratio calculator 3. In FIG. 3, reference numeral 31 indicates a sync mark detector, reference numeral 32 indicates a divider, and reference numeral 33 indicates a set value of a sync mark. The sync mark detector detects a sync mark from an output sequence of the A/D converter 2. Note that, since the A/D converter 2 does not invariably operate at channel bit cycles in this configuration, the output sequence of the A/D converter 2 is binarized, and sync mark detection is performed based on state transition intervals of the binarized output sequence. For example, in the case of a DVD-ROM, if a ratio between the state transition intervals is proportional to 14:4 (7:2), it may be determined that a sync mark is detected. For the sync mark detection, a margin may be set. By thus obtaining the ratio between a sync mark measured with the output clock of the clock generator 1 and a sync mark counted at the channel bit cycles (14T+4T: T is the channel bit cycle), the frequency ratio (cycle ratio) between the channel frequency (channel rate) of a reproduced signal and the frequency of the output clock of the clock generator 1 can be calculated.

The pseudo-synchronous clock generator 5 calculates a ratio of the clock cycle of the clock generator 1 to the channel bit cycle of a reproduced signal based on the resultant frequency ratio, thins the output clock of the clock generator 1, depending on the cycle ratio, to generate a pseudo-synchronous clock which is pseudo-synchronous therewith, and calculates a phase position of the pseudo-synchronous clock. Note that an output result of the phase correction amount calculator 4 needs to be reflected on the timing of the thinning, taking into consideration fluctuations (jitters) in the reproduced signal or variations in the channel frequency of the reproduced signal.

Figure 4:
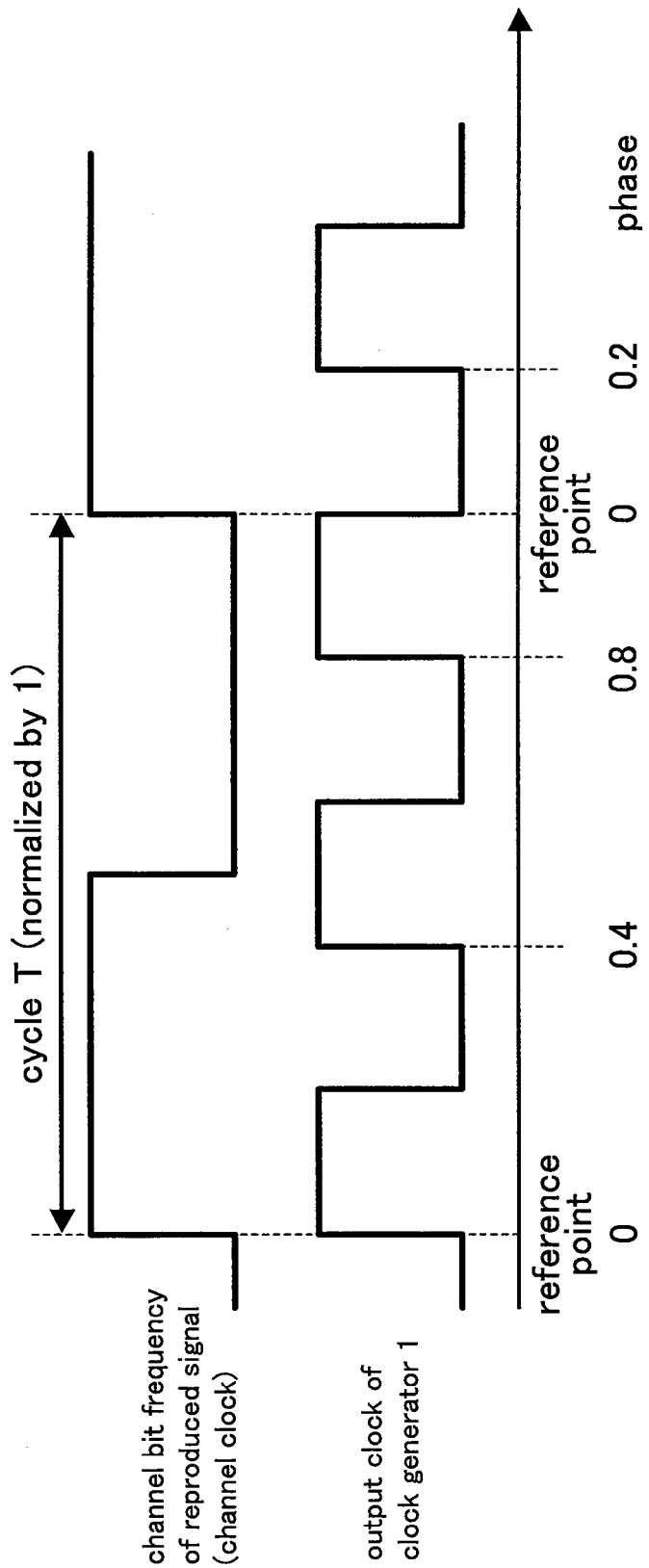
FIG. 4 is a diagram showing phase states of an output clock of a clock generator which is normalized using a channel bit cycle of a reproduced signal.
Figure 5:
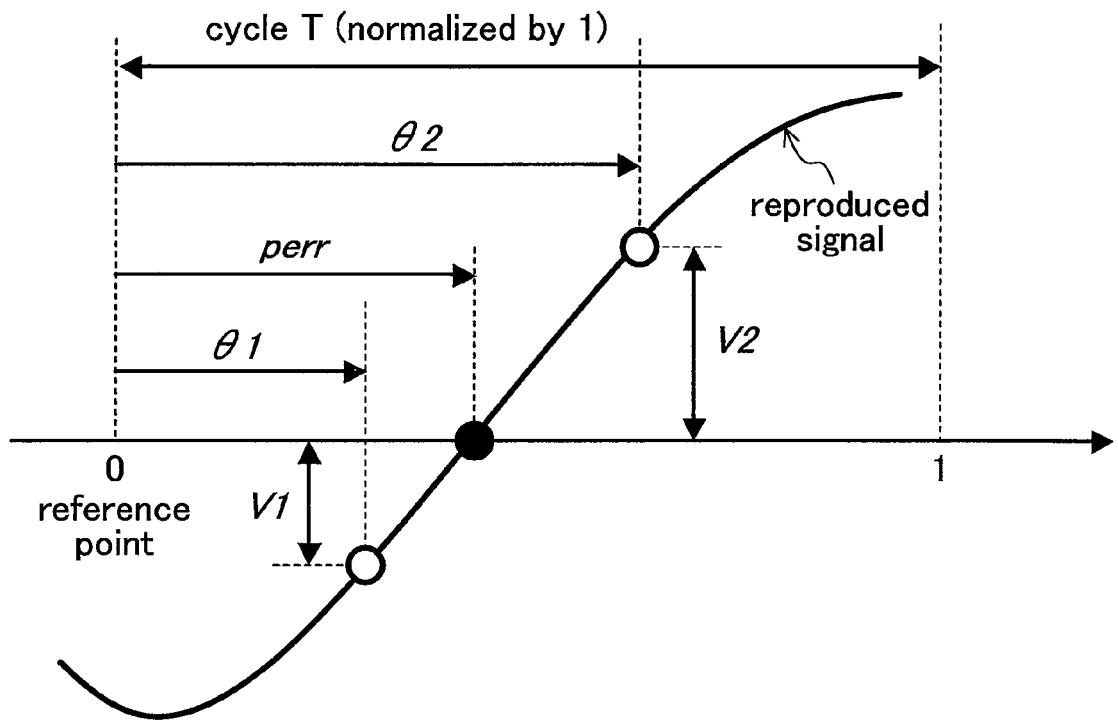
FIG. 5 is a diagram showing a relationship between a correction amount of a phase correction amount calculator and an output sampled value of an A/D converter 2 in the reproduced signal processor of the first embodiment.

FIG. 4 is a timing chart of the channel clock of a reproduced signal and the output clock of the clock generator 1. In FIG. 4, reference edges thereof are aligned, and the frequency of the output clock of the clock generator 1 is assumed to be 2.5 times as high as the channel frequency (channel rate) of the reproduced signal. As shown in FIG. 4, when the channel bit cycle of the reproduced signal is 1, the phase state of the output clock of the clock generator 1 takes 0.4, 0.8 and 0.2 (actually 1.2, but 1.2−1=0.2 where the channel bit cycle of the reproduced signal is used as a reference). In an actual system, since most of the edges of the output clock of the clock generator 1 do not match the reference points, phase correction needs to be performed. For a phase error, a phase correction amount perr shown in FIG. 5 may be calculated. In FIG. 5, a closed circle indicates an ideal sample value, and open circles indicate sample result values of the reproduced signal when the clock generated by the clock generator 1 is used. Since the frequency ratio between the channel frequency (channel rate) of the reproduced signal and the frequency of the output clock of the clock generator 1 is known, phase errors θ1 and θ2 can be calculated. Also, voltage values V1 and V2 are output results of the A/D converter 2 and therefore are known. Therefore, the phase correction amount perr is represented by:

$$perr = \frac{\theta 2 \times |V1| + \theta 1 \times |V2|}{|V1| + |V2|} \quad \text{(Expression 1)}$$

(note that $\theta 2 > \theta 1$)

Note that the phase correction amount perr may be calculated using other methods. Thus, the phase correction amount calculator 4 calculates a phase correction amount between the output clock of the clock generator 1 and the reproduced signal.

The frequency lock detector 8 reads a variation in the frequency ratio output by the frequency ratio calculator 3, determines whether or not the frequency ratio is stable, and outputs a frequency lock signal when the frequency ratio is stable. Also, when a variation occurs in the frequency of a reproduced signal and a variation in the frequency ratio exceeds a predetermined value, or when the frequency ratio significantly changes, frequency lock is released. Also, when the frequency ratio is smaller than 1.0, i.e., when the frequency of the output clock of the clock generator 1 is lower than the channel frequency of the reproduced signal, frequency lock is not detected. Note that the frequency lock detector 8 may additionally have a function of avoiding detection of frequency lock when the frequency ratio falls within a preset range.

Figure 6:
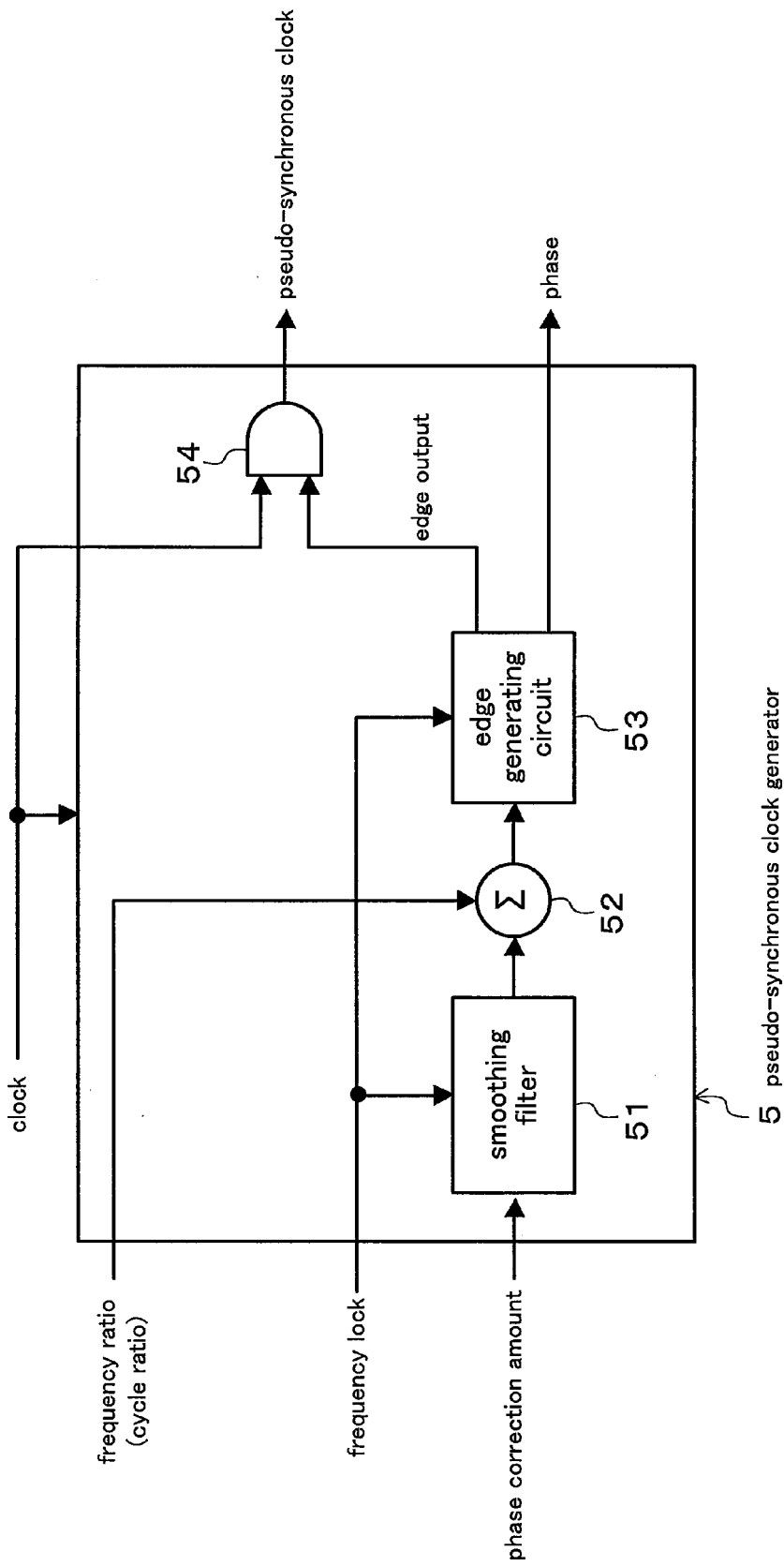
FIG. 6 is a diagram showing an example configuration of a pseudo-synchronous clock generator included in the reproduced signal processor of the first embodiment.
Figure 7:
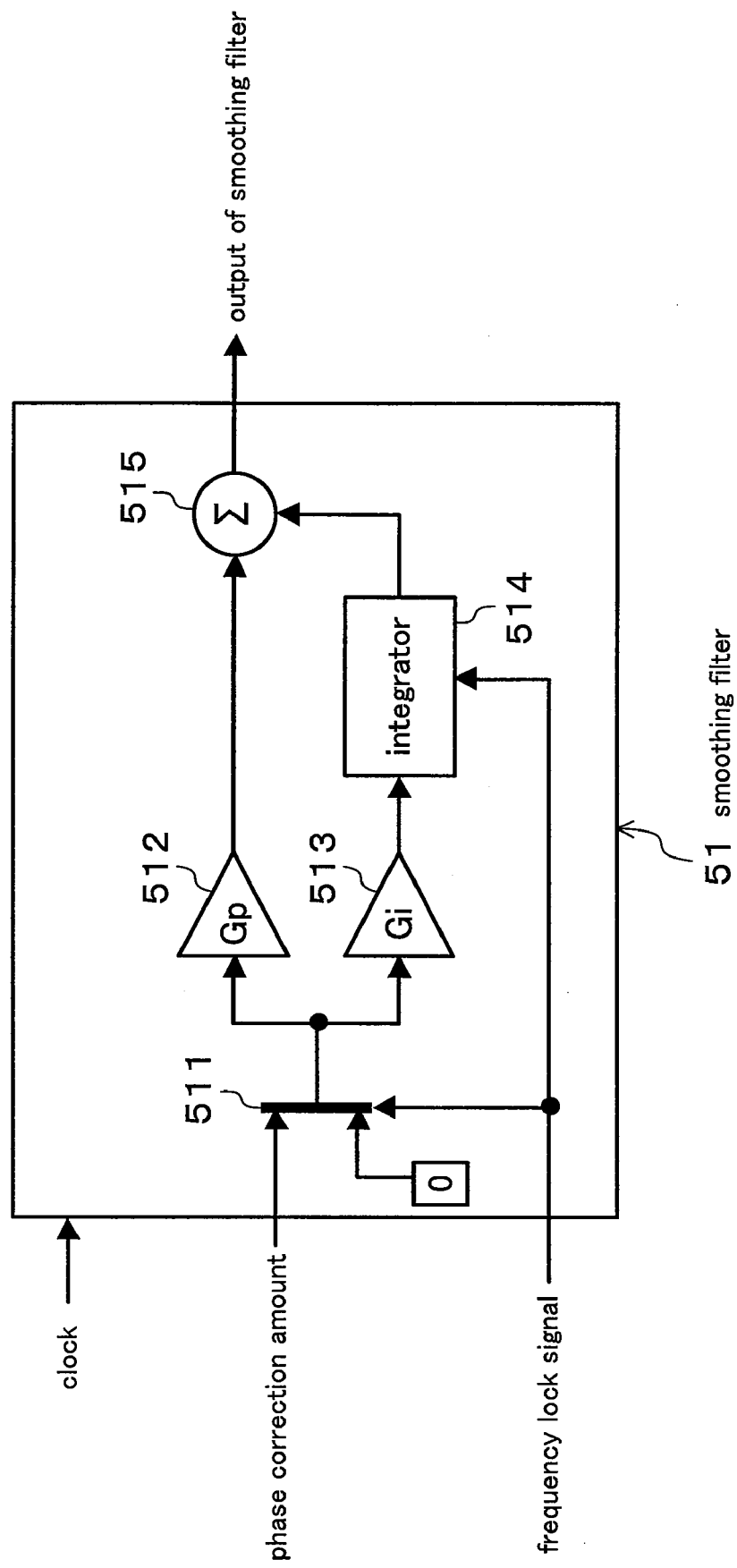
FIG. 7 is a diagram showing an example configuration of a smoothing filter included in the pseudo-synchronous clock generator.

Next, an example configuration of the pseudo-synchronous clock generator 5 is shown in FIG. 6. In FIG. 6, reference numeral 51 indicates a smoothing filter which smoothes a phase correction amount, and is operated after frequency lock is detected. The smoothing filter 51, for example, typically includes a portion which performs a proportional calculation and a portion which performs an integral calculation as shown in FIG. 7. In FIG. 7, before frequency lock is detected, an output of a selector 511 is 0 and an integrator is reset to 0, so that the output of this block is 0. After frequency lock is detected, the proportional term and the integral term of the phase correction amount are separately calculated. The proportional term is multiplied by a gain Gp by a multiplier 512. The integral term is multiplied by a gain Gi by a multiplier 513 before integral calculation is performed by an integrator 514. The proportional term and the integral term are added by an adder 515, and the result is output to an adder 52 (see FIG. 6) which follows the smoothing filter 51, i.e., is connected to the output side of the smoothing filter 51. The adder 52 adds the frequency ratio (cycle ratio) and the output of the smoothing filter 51, and outputs a cycle (normalized value where the channel bit cycle is 1) at a current time of the output clock of the clock generator 1.

Figure 8:
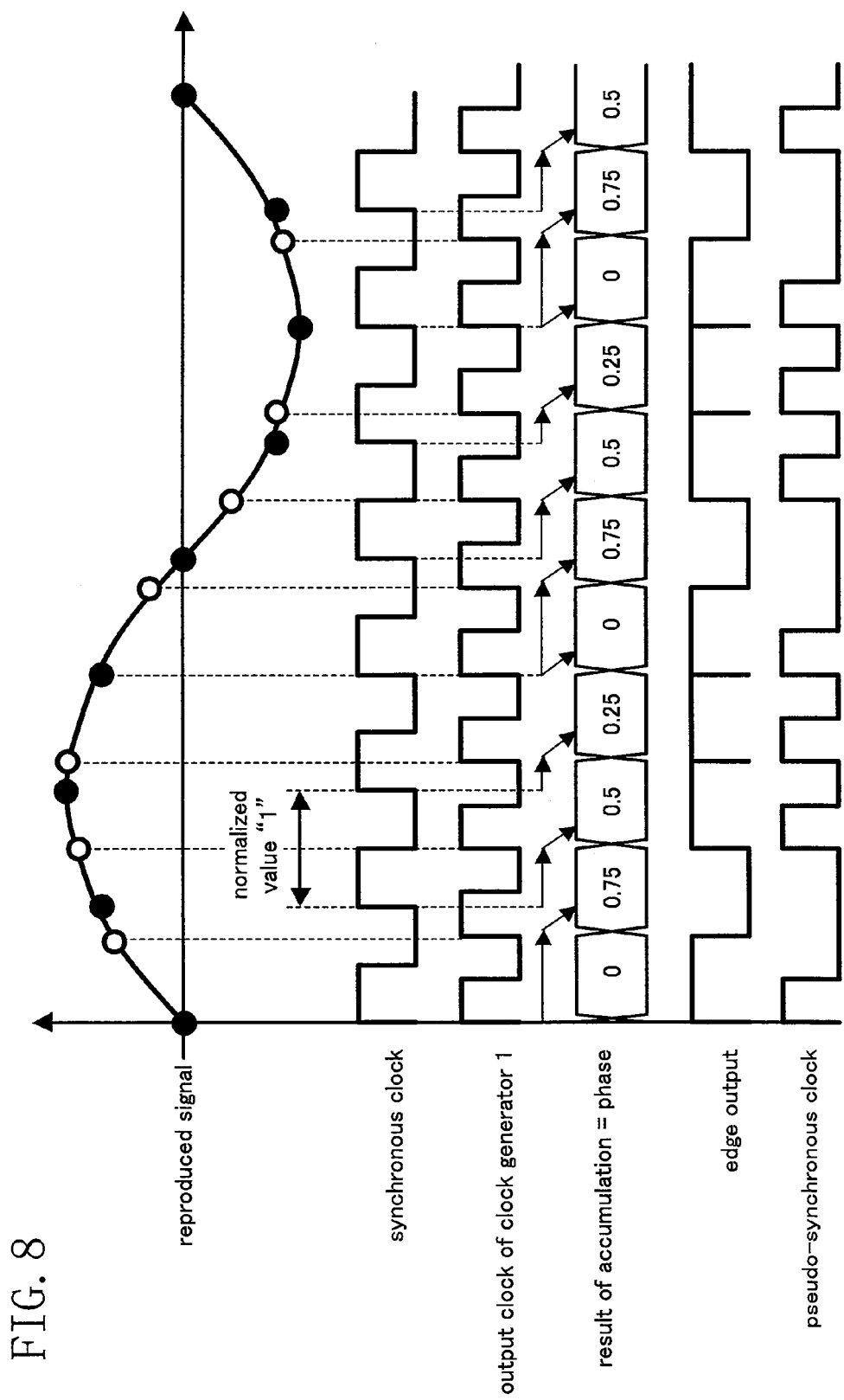
FIG. 8 is a diagram showing a process of operating the pseudo-synchronous clock generator.

In the pseudo-synchronous clock generator 5 of FIG. 6, an edge generating circuit 53 performs mod 1 calculation with respect to a cycle at a current time of the output clock of the clock generator 1. Specifically, a process of accumulating input cycle values is performed, and when a result of the calculation exceeds "1," a value obtained by subtracting "1" from the result is set as a result of the accumulation. For example, in an example shown in FIG. 8, a frequency ratio between the frequency of the output clock of the clock generator 1 and the reproduction rate is 1.33 (a corresponding cycle ratio is 0.75 where the cycle of the reproduction rate is assumed to be 1). In this case, the cycle of the output clock of the clock generator 1 is a constant value 0.75. Therefore, the edge generating circuit 53 performs a process of accumulating 0.75 in synchronization with the output clock of the clock generator 1. In this case, if accumulation is simply performed, a result of the accumulation is 0, 0.75, 1.5, and so on. Actually, since the mod 1 calculation is performed every time, a result of the accumulation is 0, 0.75, 0.5 (since 1.5 exceeds 1, a value obtained subtracting 1 from 1.5 is a result of the mod 1 calculation), and so on. An edge output is HI if the subtraction process is performed after the mod 1 calculation is performed. Also, a phase is a result of the mod 1 calculation. The AND circuit 54 performs AND calculation with respect to the edge output of the edge generating circuit 53 and the output clock of the clock generator 1, and outputs the result as a pseudo-synchronous clock.

Figure 9:
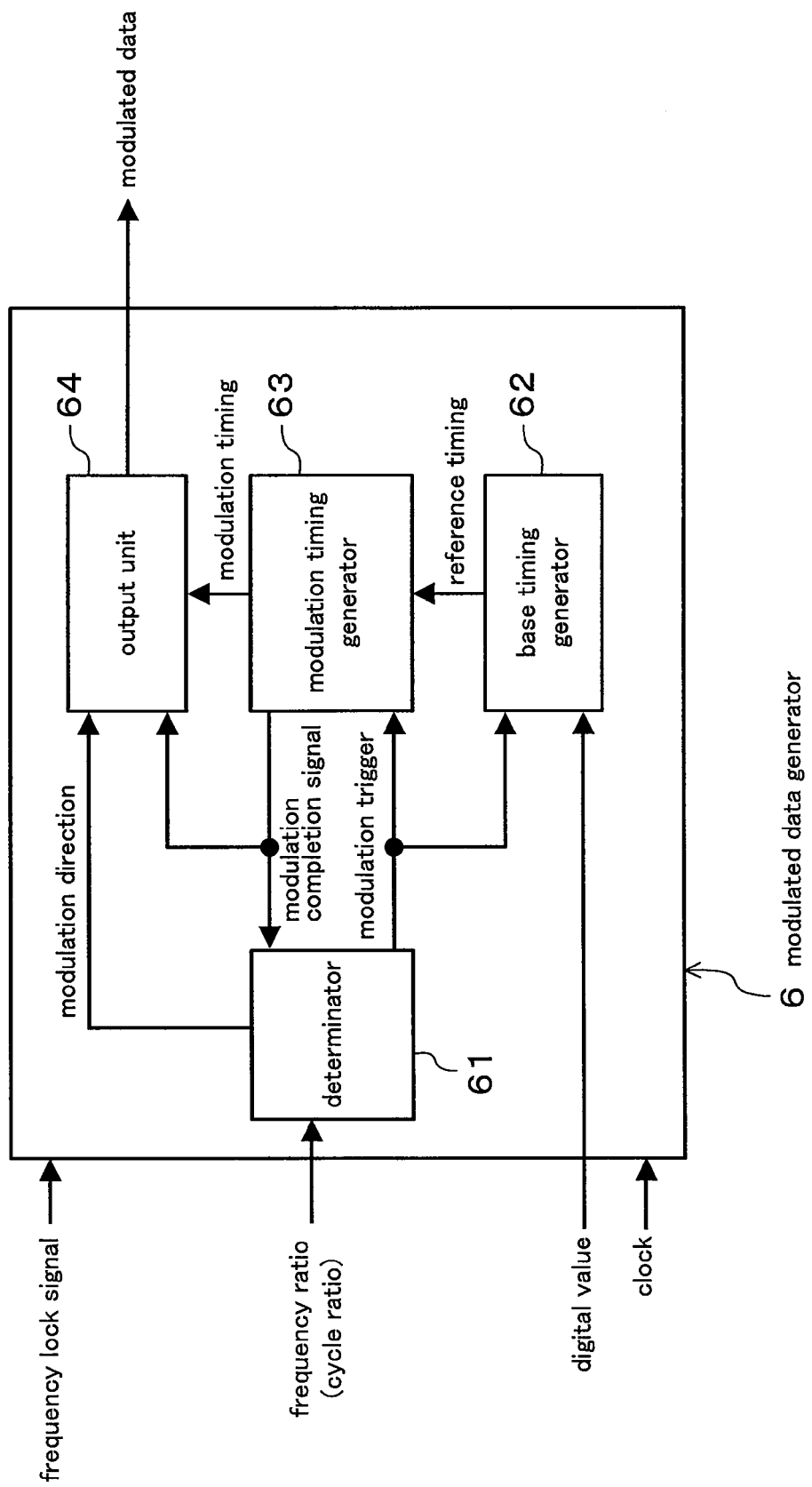
FIG. 9 is a diagram showing an example configuration of a modulated data generator included in the reproduced signal processor of the first embodiment.

Next, a configuration of the modulated data generator 6 of FIG. 1 will be described. FIG. 9 shows an example configuration of the modulated data generator 6. The modulated data generator 6 is operated based on whether or not the frequency ratio (cycle ratio) input from the frequency ratio calculator 3 satisfies a preset condition, after the frequency lock detector 8 detects frequency lock. Briefly, a result of this operation is generation of modulated data in which the oscillation frequency of the voltage controlled oscillator (VCO) 12 of the clock generator 1 gradually varies as shown in the lowest portion of FIG. 14 (an increase in FIG. 14), after the frequency lock which satisfies the preset condition. Hereinafter, a specific description will be given.

Figure 10:
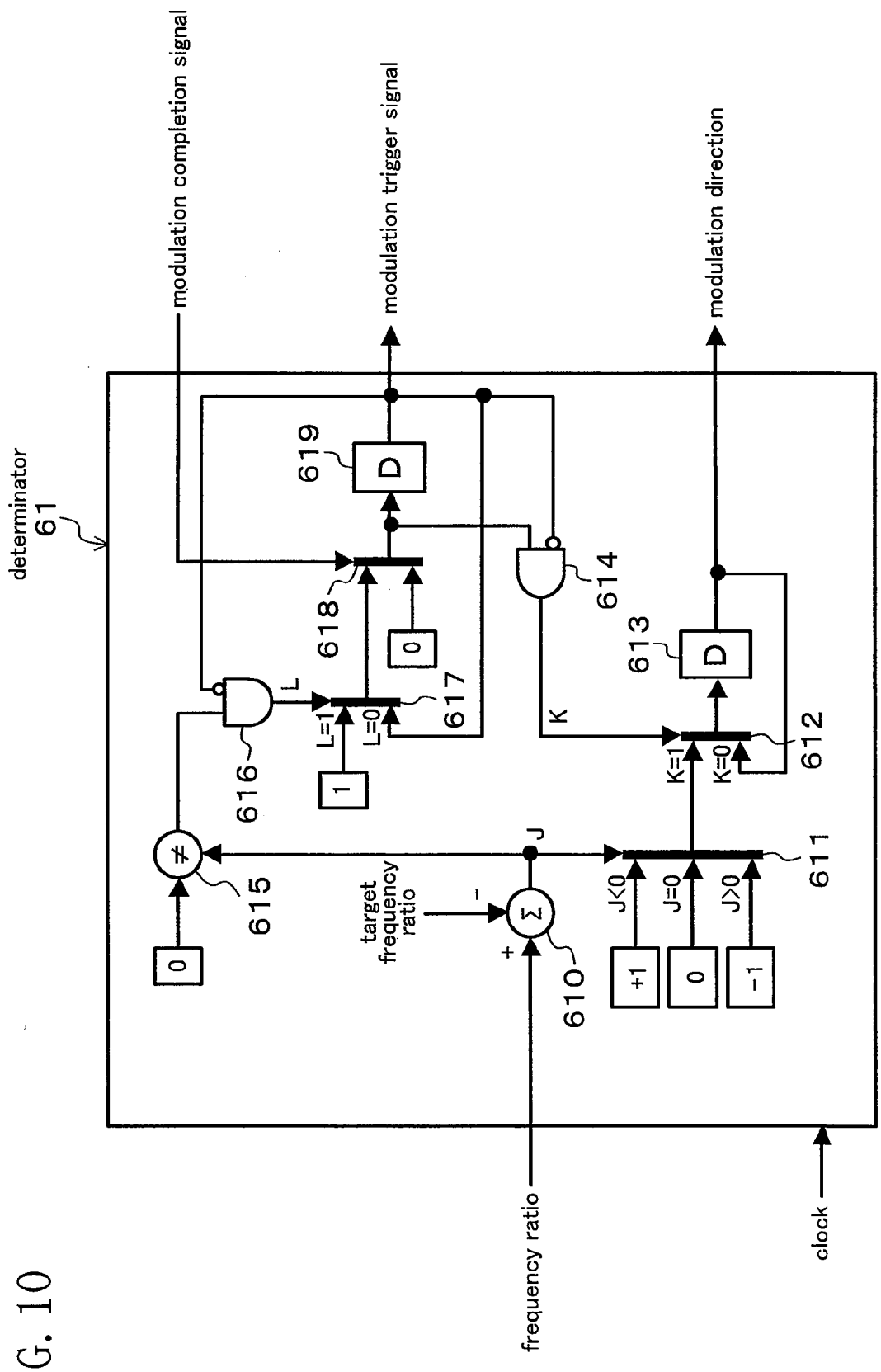
FIG. 10 is a diagram showing an example configuration of a determinator included in the modulated data generator.

In the modulated data generator 6 of FIG. 9, reference numeral 61 indicates a determinator which determines whether the input frequency ratio (cycle ratio) is larger or smaller than a target frequency ratio, and outputs a modulation trigger signal and a signal indicating a modulation direction (whether the frequency of the output clock of the clock generator 1 is to be increased or decreased). A specific example configuration of the determinator 61 is shown in FIG. 10. Note that the value of each register of FIG. 10 is set to 0 as an initial value (at the time of resetting). In FIG. 10, a subtractor 610 calculates a difference between the input frequency ratio and the target frequency ratio. A selector 611 outputs one of +1, 0 and −1, depending on the polarity and value of a result J of the difference calculation. For example, when the target frequency ratio is 1.1 and the input frequency ratio is 1.2, the value of the calculation result J is 0.1, and the output of the selector 611 is −1. The output of the selector 611 means a modulation direction. In this example, since the frequency ratio is higher than the target frequency ratio, −1 is selected so as to perform frequency control to decrease the frequency. The output of the selector 611 is stored via a selector 612 into a register 613, and is output as a signal indicating a modulation direction. When the output of the subtractor 610 is not 0, the output of a comparator 615 is 1, and therefore, the modulation trigger signal is updated, depending on a state of the modulation trigger signal. In this example, the output of a selector 618 is 0 in accordance with a modulation completion signal. When the value of a register 619 storing the modulation trigger signal is 0, then if the output of the comparator 615 is 1, the output L of a logic calculation circuit 616 is 1 and the output of a selector 617 is 1, so that the modulation trigger signal is asserted. When the modulation completion signal is input, the modulation trigger signal is set to 0. The aforementioned signal indicating a modulation direction is updated at a trigger edge (timing at which 0 is changed to 1) of the modulation trigger signal. Note that, in this example, the determination criterion of the determinator 61 is whether or not the frequency ratio matches the target frequency ratio. Alternatively, the control may be configured so that the target frequency ratio is set as a predetermined range, and modulation is not performed if the frequency ratio falls within the range.

Figure 11:
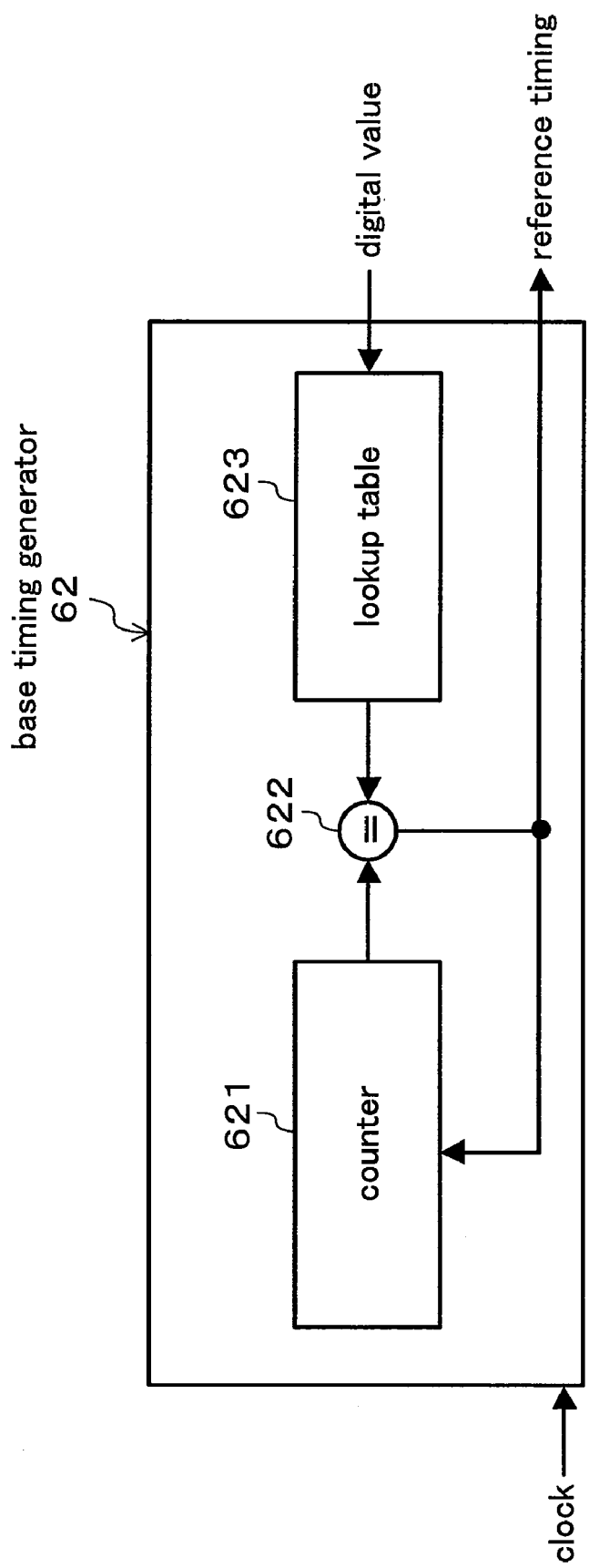
FIG. 11 is a diagram showing an example configuration of a base timing generator included in the modulated data generator.
Figure 12:
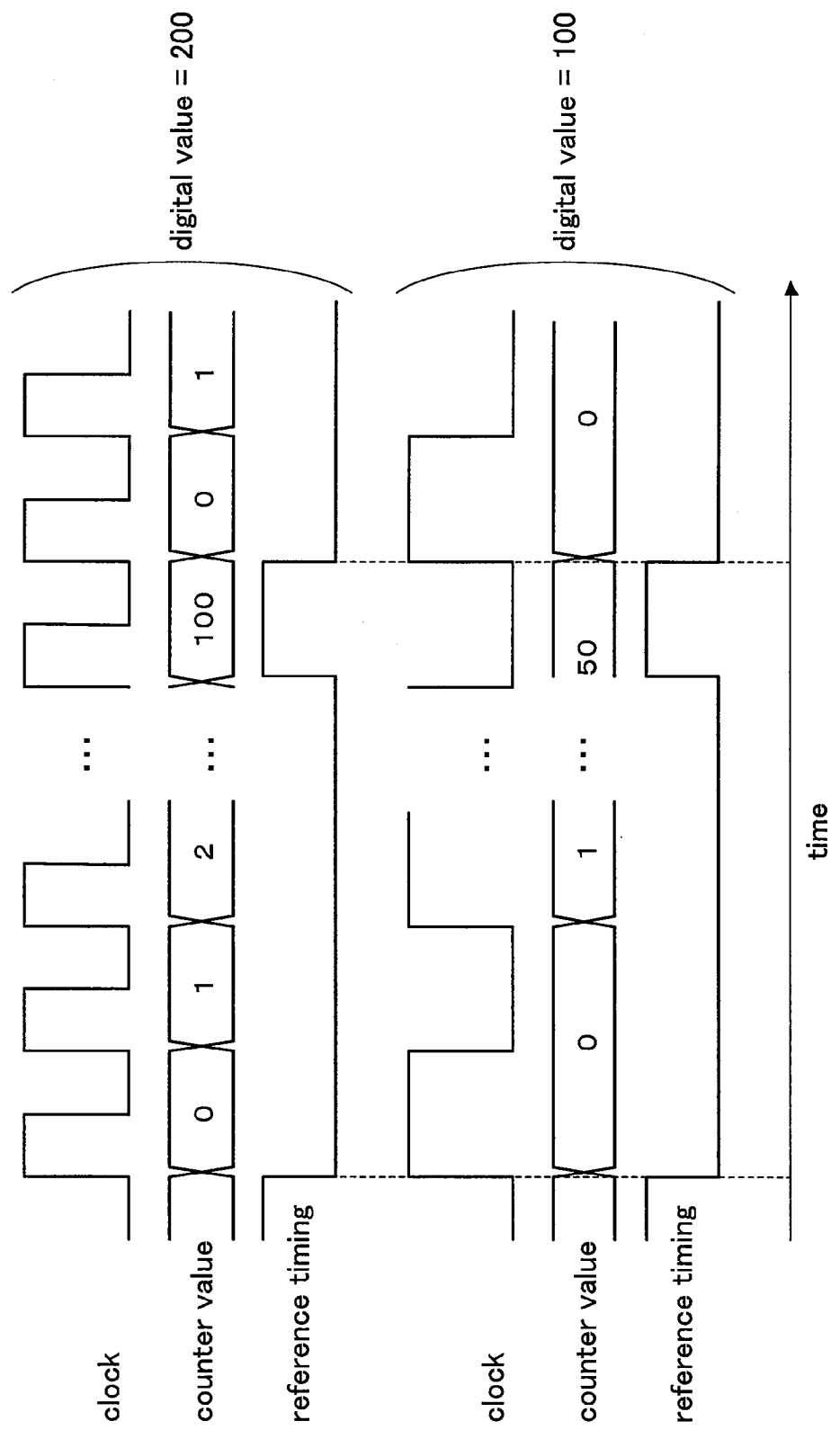
FIG. 12 is a timing chart of a circuit of FIG. 21.

In the modulated data generator 6 of FIG. 9, a base timing generator 62 outputs reference timings which are a base for the rate of modulation, depending on digital values input to the clock generator 1. An example configuration of the base timing generator 62 is shown in FIG. 11. The base timing generator 62 includes a counter 621, a comparator 622, and a lookup table 623. The counter 621 performs increment calculation in synchronization with an input clock, and when the value is equal to an output of the lookup table 623, generates a signal indicating a reference timing. Note that this signal is also used as a reset signal for the counter 621. The lookup table 623 outputs a digital value corresponding to an input digital value. FIG. 12 shows an example timing chart of the base timing generator 62. FIG. 12 shows two cases where the input digital value takes 200 and 100. In this example, the clock generator 1 is assumed to change the clock frequency by a factor of two, depending on the input digital value. Therefore, the clock cycle is changed by a factor of two between the case where the digital value is 200 and the case where the digital value is 100. When it is desirable to provide uniform reference timing intervals on a time basis, it is necessary to change timings at which the reference timing signal input is generated, i.e., timings at which the counter 621 is reset, depending on the input digital value. In this example, the lookup table 623 performs conversion of digital values so as to provide uniform intervals at which the reference timing signal is generated. This is required when it is desirable to provide uniform timings of modulation. Note that, if design can be performed with a margin, reference timings may be generated simply using the number of clocks as a reference without using digital values input to the clock generator 1.

In the modulated data generator 6 of FIG. 9, a modulation timing generator 63, when receiving a modulation trigger from the determinator 61, generates and outputs a signal indicating modulation timings, depending on an output of the base timing generator 62. An output unit 64 generates and outputs modulated data at the modulation timings of the modulation timing signal output by the modulation timing generator 63.

Figure 13:
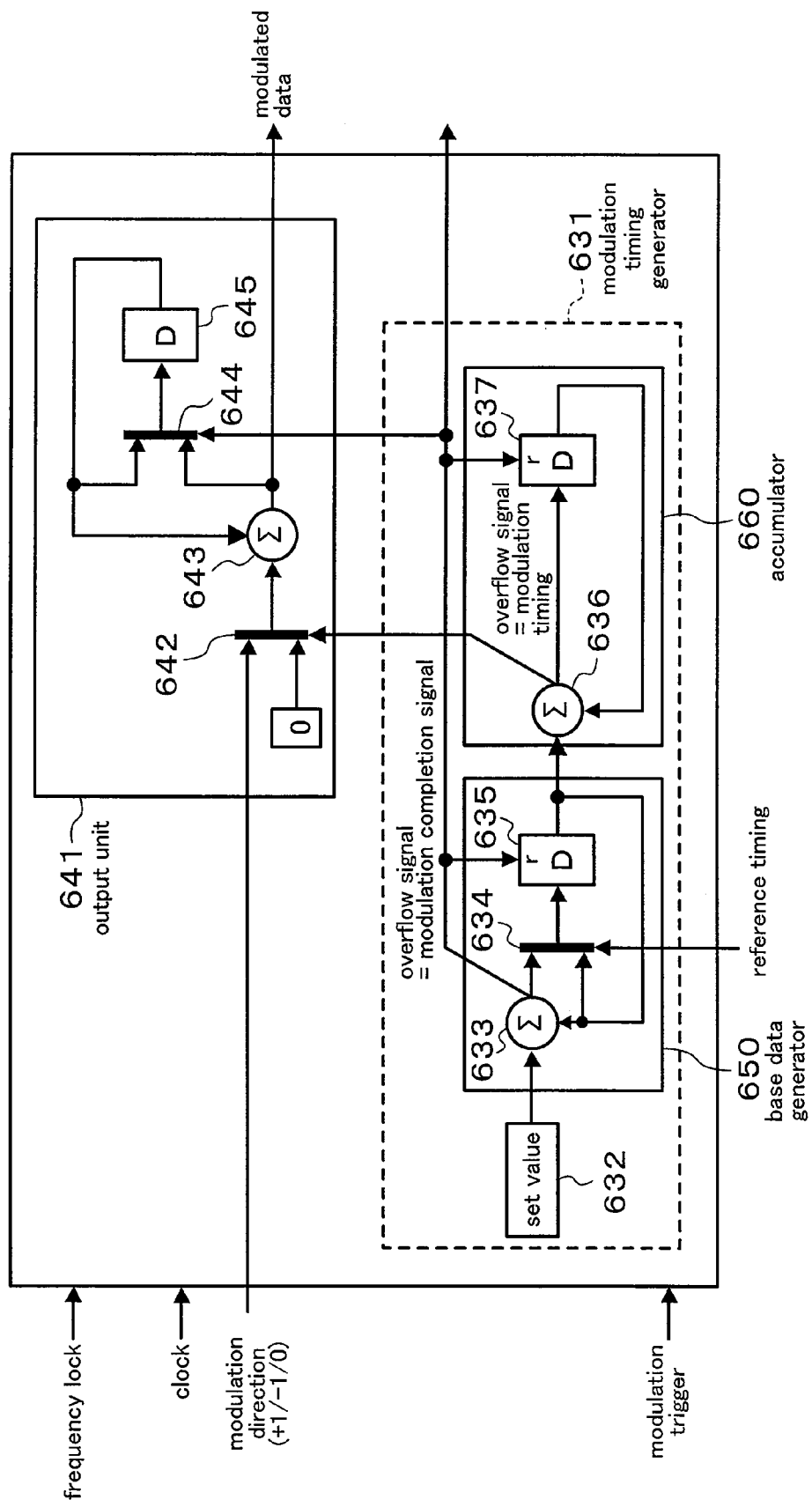
FIG. 13 is a diagram showing an example configuration of a modulation timing generator 63 and an output unit 64 of FIG. 9.
Figure 14:
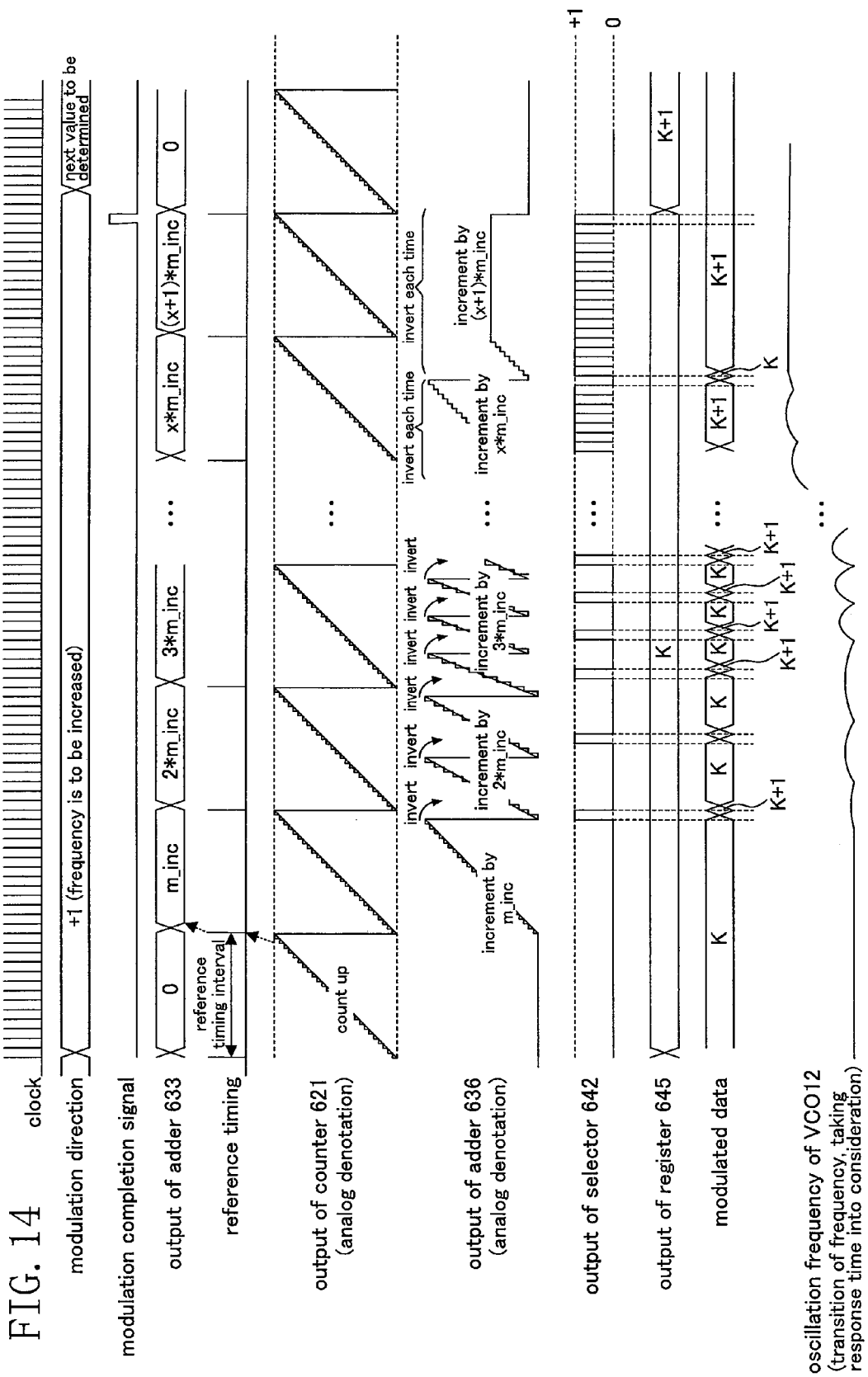
FIG. 14 is a timing chart of the modulated data generator of FIGS. 9 and 13.

Example specific configurations of the modulation timing generator 63 and the output unit 64 are shown in FIG. 13. Also, a timing chart thereof is shown in FIG. 14. The timing chart of FIG. 14 shows as an example a case where the modulation direction is +1. In a base data generator 650 including the adder 633, the selector 634 and the register 635 as shown in FIG. 14, when a modulation trigger is input after frequency lock, a result of addition of the adder 633 is updated every time the reference timing signal is received. Since the base data of the base timing generator 62 is updated in accordance with the reference timing signal, intervals at which an adder 636 overflows gradually decrease at an output of an accumulator 660 including the adder 636 and a register 637 as shown in FIG. 14. The overflow signal represents a modulation timing signal, and modulated data corresponding to a current modulation direction ("+1" in FIG. 14) is output from a selector 642. A register 645 stores a previous summation of modulation components. An adder 643 adds this value and the output of the selector 642 and outputs the result as modulated data. Note that, during modulation completion when the adder 633 overflows and the modulation completion signal is then output, a result of the adder 643 is stored via a selector 644 into the register 645 (see "output of 645" of FIG. 14). Note that, when frequency lock is no longer detected during modulation operation, the modulated data generator 6 holds the value of modulated data to be generated.

Thus, a result of addition of the output of the selector 642 and the output of the register 645 is output as modulated data from the modulated data generator 6. Incidentally, when such modulation is not performed, then if a digital value input to the clock generator 1 is changed by 1 LSB, the oscillation frequency of the VCO 12 of the clock generator 1 is changed by an amount corresponding to 1 LSB, depending on the resolution of the DAC 11. Although a lower resolution of the DAC 11 is preferable to a reduction in size of the system, a certain level of resolution is required, taking the loop stability into consideration. If there is not a margin for the resolution, then when an input digital value is changed by 1 LSB, the less loop stability prevents the A/D converter 2 from satisfactorily performing A/D conversion, likely leading to a failure, such as release of lock or the like. Therefore, the modulated data generator 6 is considerably useful so as to ensure a margin for the trade-off.

Figure 15:
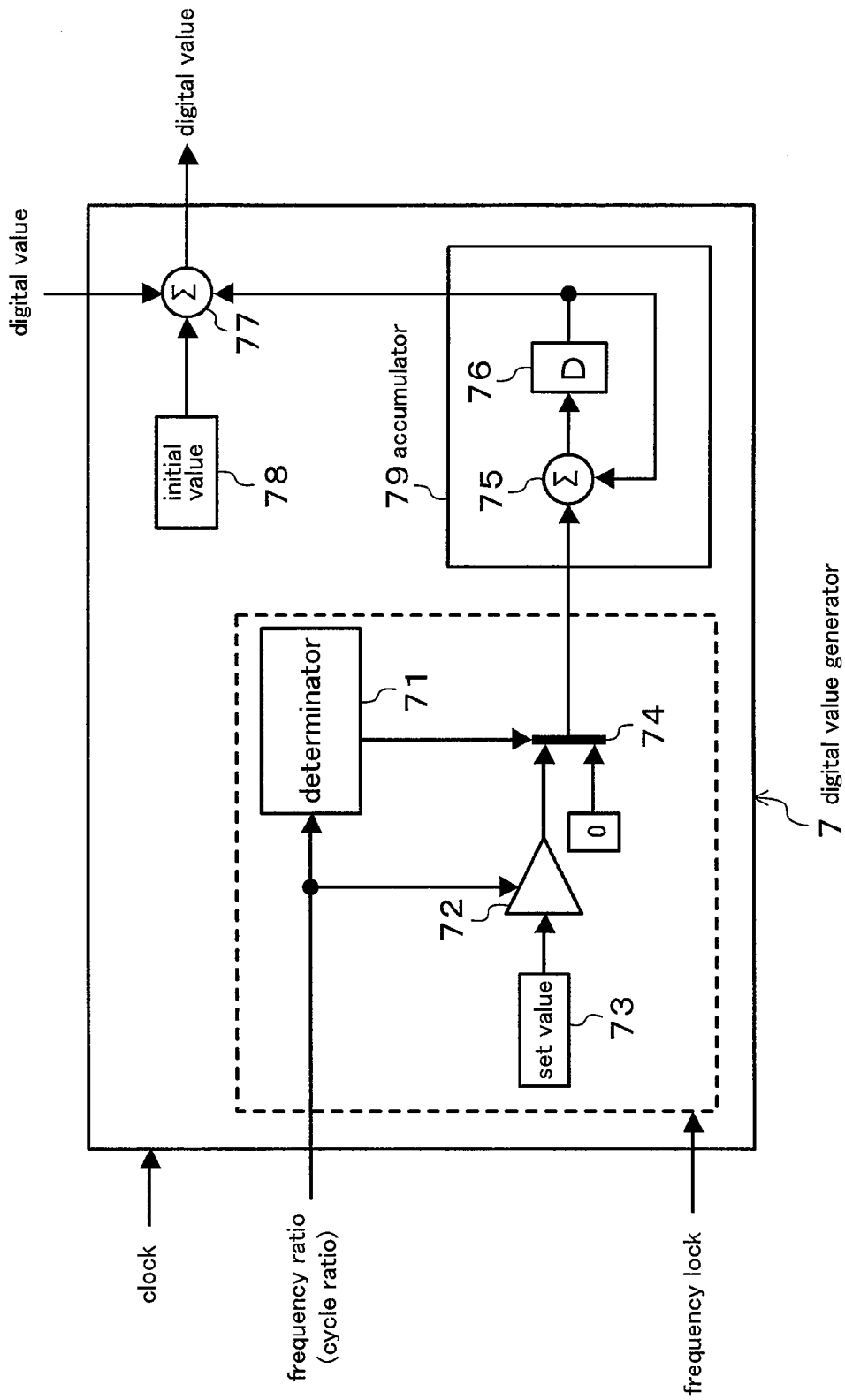
FIG. 15 is a diagram showing an example configuration of a digital value generator 7 of FIG. 1.

Next, a digital value generator 7 of FIG. 1 will be described. An example configuration of the digital value generator 7 is shown in FIG. 15. In the digital value generator 7 of FIG. 15, a determinator 71, when the frequency lock detector 8 does not detect frequency lock, determines whether the frequency of the output clock of the clock generator 1 is higher or lower than the channel frequency of the reproduced signal, based on the calculated frequency ratio (cycle ratio). When the frequency of the output clock of the clock generator 1 is lower than the channel frequency of the reproduced signal, the determinator 71 generates a select signal so that a result of gain multiplication control of a set value 73 by a gain controller 72, depending on a current frequency ratio, is an output of a selector 74. The output of the selector 74 is accumulated by an accumulator 79 including an adder 75 and a register 76, and is controlled so that the frequency of the output clock of the clock generator 1 becomes higher than the channel frequency of the reproduced signal. An adder 77 adds an output of the register 76, an initial value 78, and modulated data from the modulated data generator 6 to generate a digital value to be input to the clock generator 1. Also, when a significant frequency variation occurs in the channel frequency of the reproduced signal during reproduction and therefore frequency lock is no longer detected, then if the output clock frequency of the clock generator 1 with respect to the channel frequency of the reproduced signal exceeds a preset range, the determinator 71 generates a select signal so that a gain multiplication control of the set value 73 by the gain controller 72, depending on a current frequency ratio, is an output of the selector 74, and performs control so that the frequency ratio becomes a set value or falls within a set range. Note that, in FIG. 15, when the output clock frequency of the clock generator 1 is higher or lower than the channel frequency of the reproduced signal, the output of the gain controller 72 is directly selected by the selector 74. Alternatively, when the output clock frequency of the clock generator 1 is lower than the channel frequency of the reproduced signal, a predetermined offset may be added to the output value of the gain controller 72, and the resultant value may selected by the selector 74, and when the output clock frequency of the clock generator 1 is higher than the channel frequency of the reproduced signal, a predetermined offset value may be subtracted from the output value of the gain controller 72, and the resultant value may be selected by the selector 74. In this case, the response of the output clock frequency of the clock generator 1 can be further improved.

Figure 16:
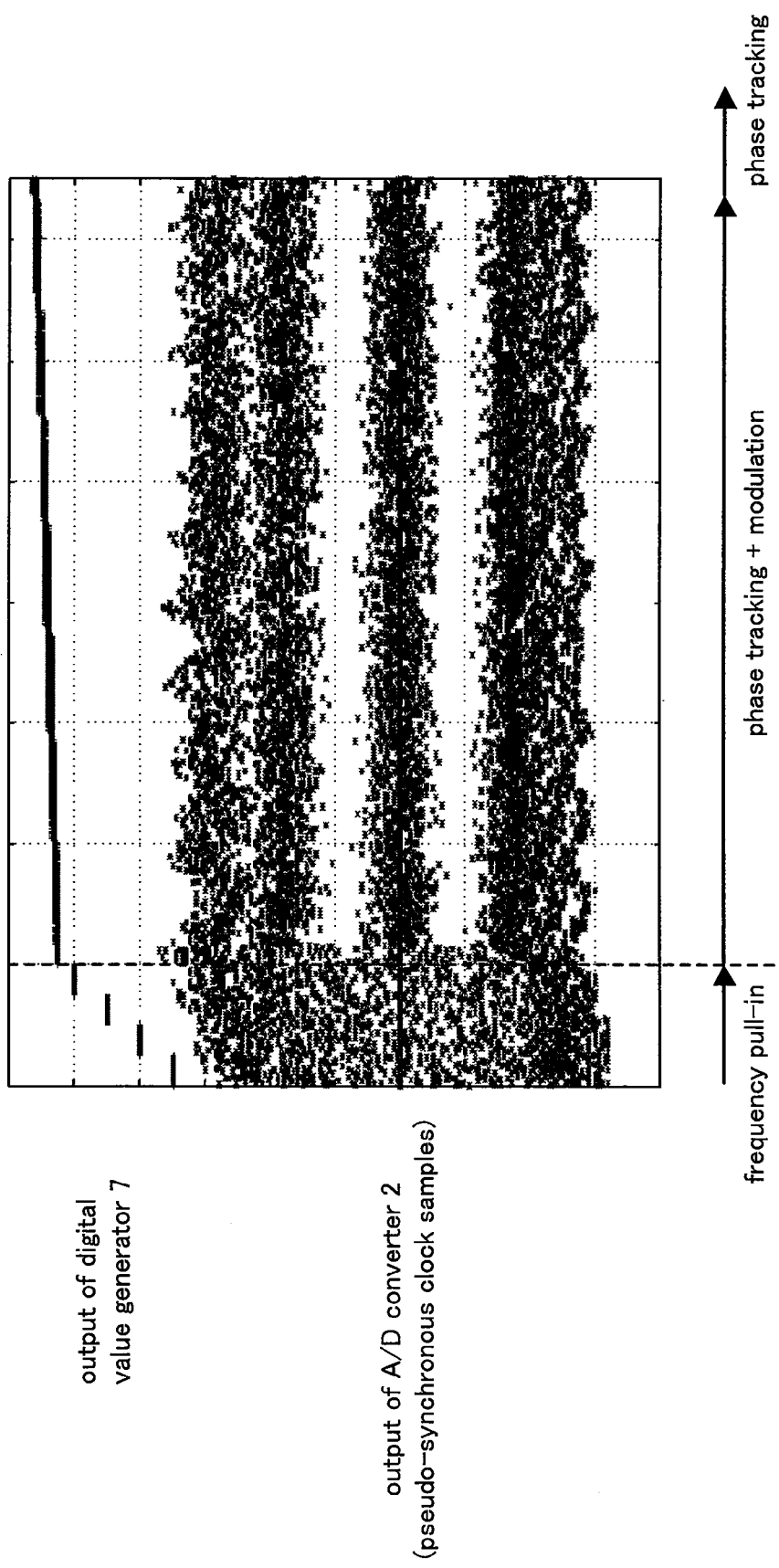
FIG. 16 is a diagram showing a process of operating the reproduced signal processor of FIG. 1.

FIG. 16 shows operation timings of the aforementioned reproduced signal processor. A frequency pull-in section until frequency lock is detected is a region in which the cycle ratio is sufficiently smaller than the preset range. Therefore, in the frequency pull-in section, the output of the digital value generator 7 is steeply updated to a high level. Note that, when the frequency ratio exceeds the set range and steeply changes during reproduction, or when the frequency of the output clock of the clock generator 1 is lower than the channel frequency of the reproduced signal, a similar calculation is performed. After frequency lock is detected, the phase correction amount calculator 4 and the modulated data generator 6 are operated so that the output of the frequency ratio calculator 3 takes a predetermined value (or falls within a value range) while a locked state is held in which sampling of the A/D converter 2 with the pseudo-synchronous clock is satisfactorily performed.

Variation of First Embodiment

Figure 17:
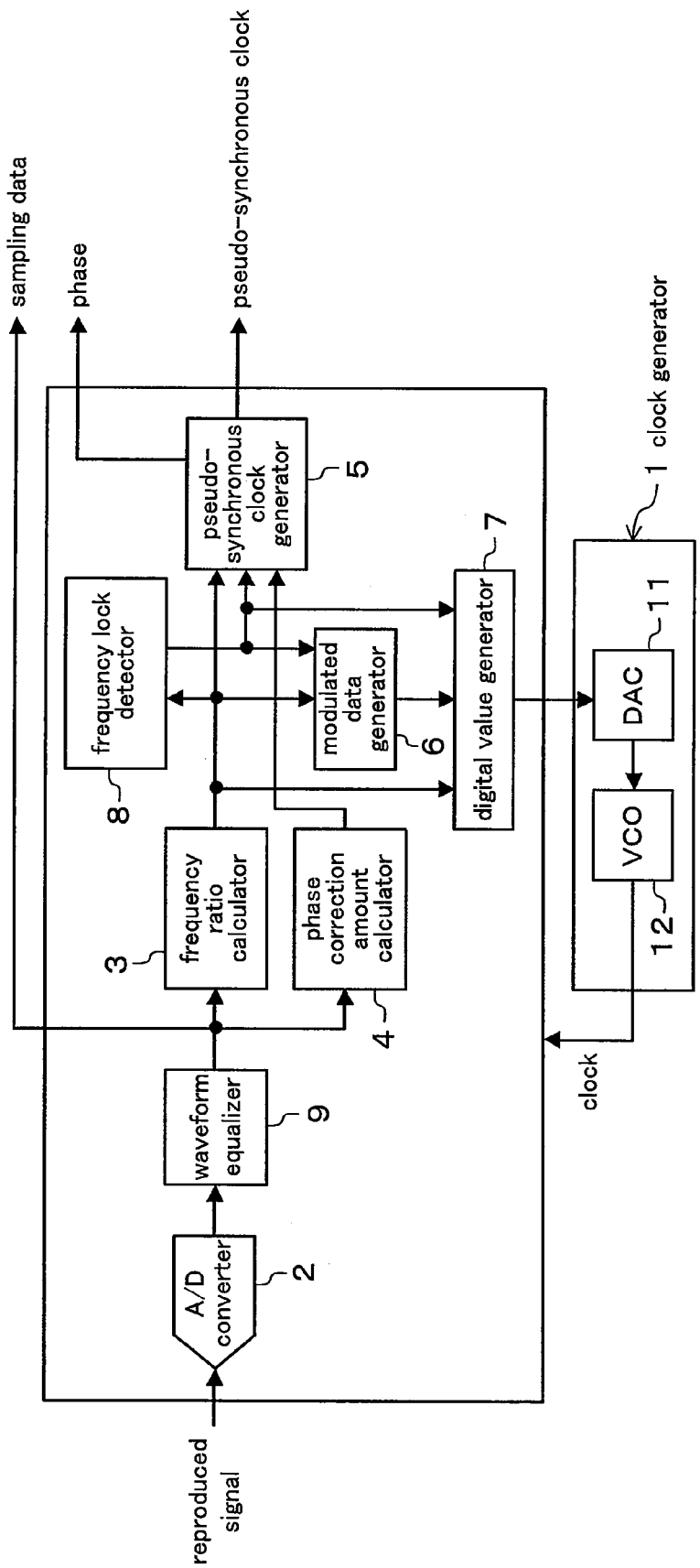
FIG. 17 is a block diagram showing a variation of the reproduced signal processor of FIG. 1.
Figure 18:
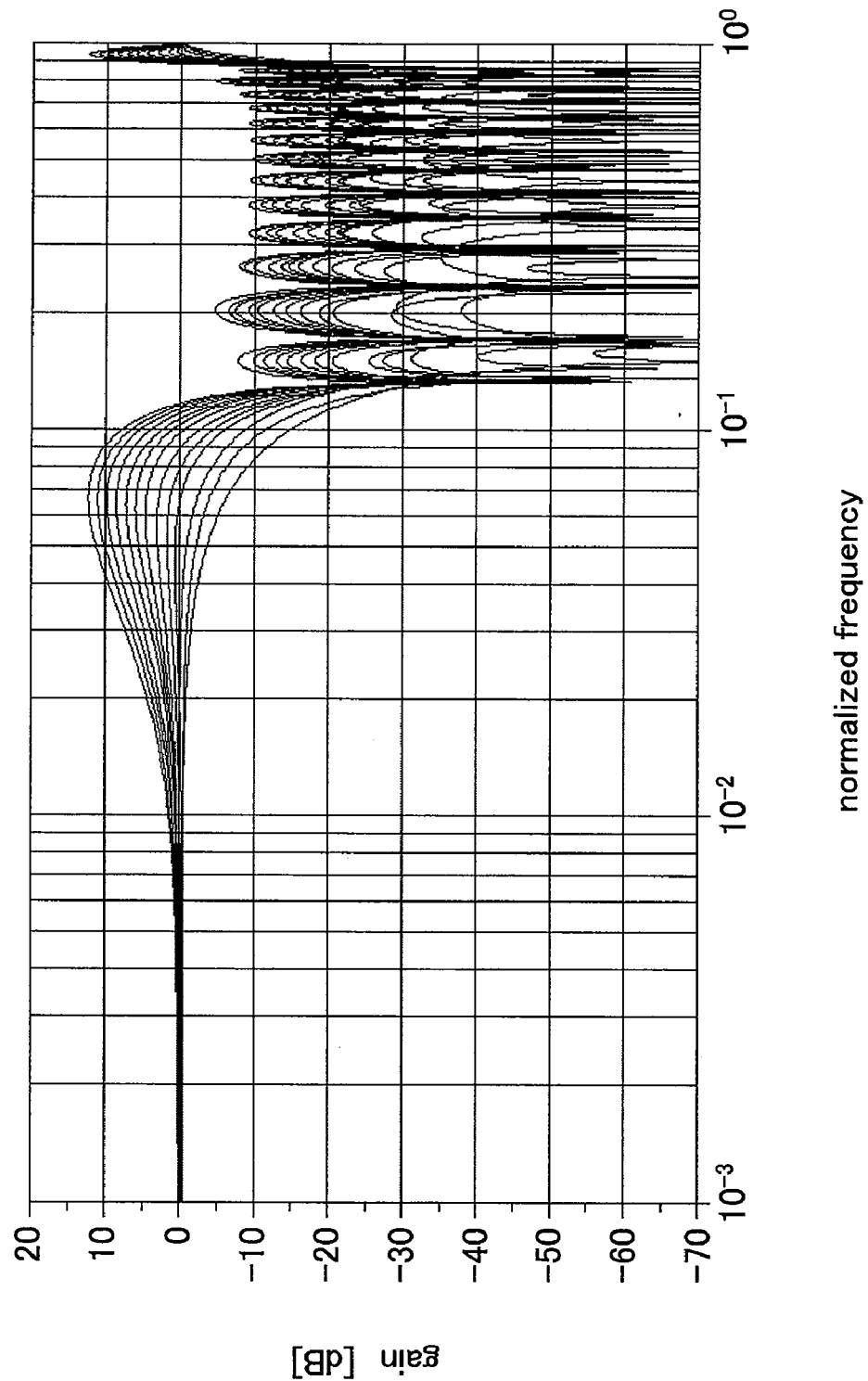
FIG. 18 is a diagram showing example gain characteristics of a waveform equalizer included in the reproduced signal processor.
Figure 19:
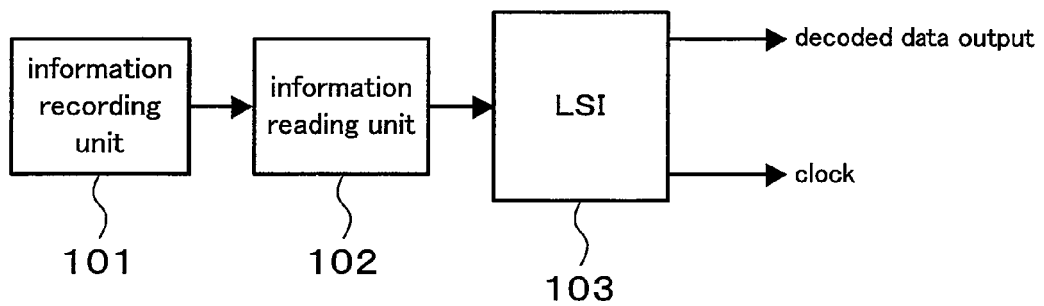
FIG. 19 is a block diagram schematically showing a whole configuration of an information reproduction apparatus including the reproduced signal processor of FIG. 1.
Figure 20:
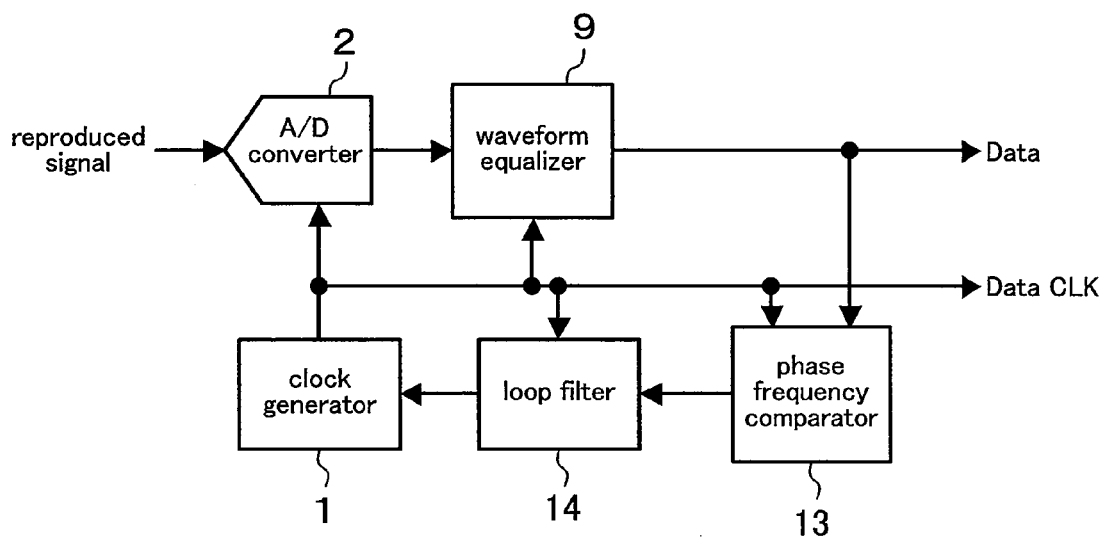
Figure 21:
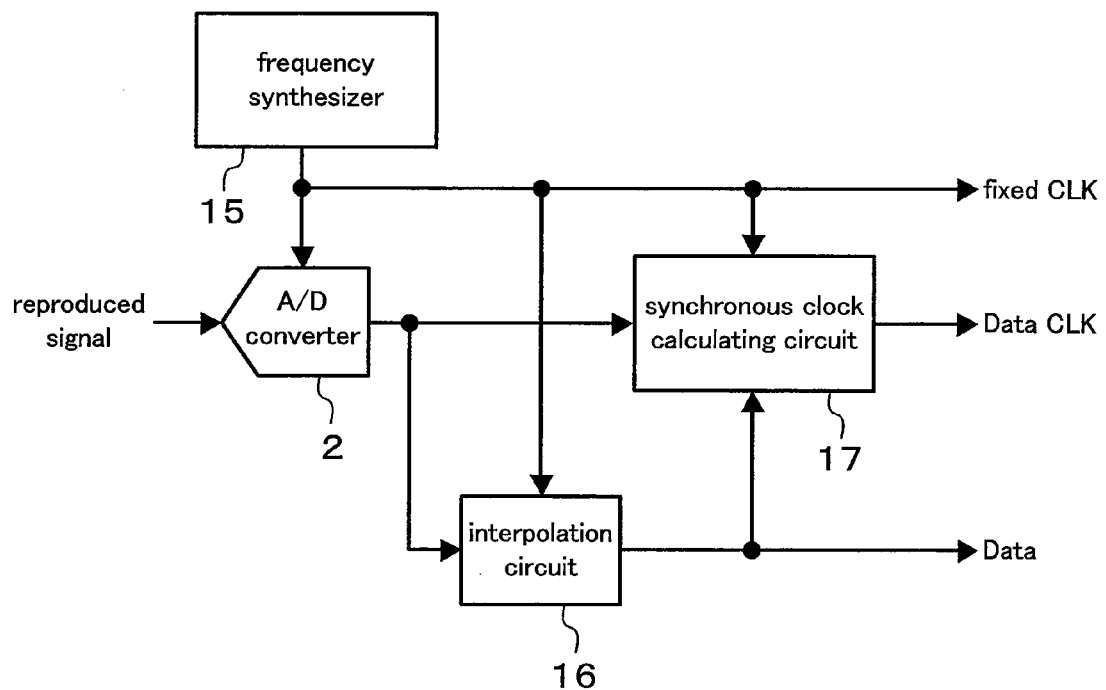
Figure 22:
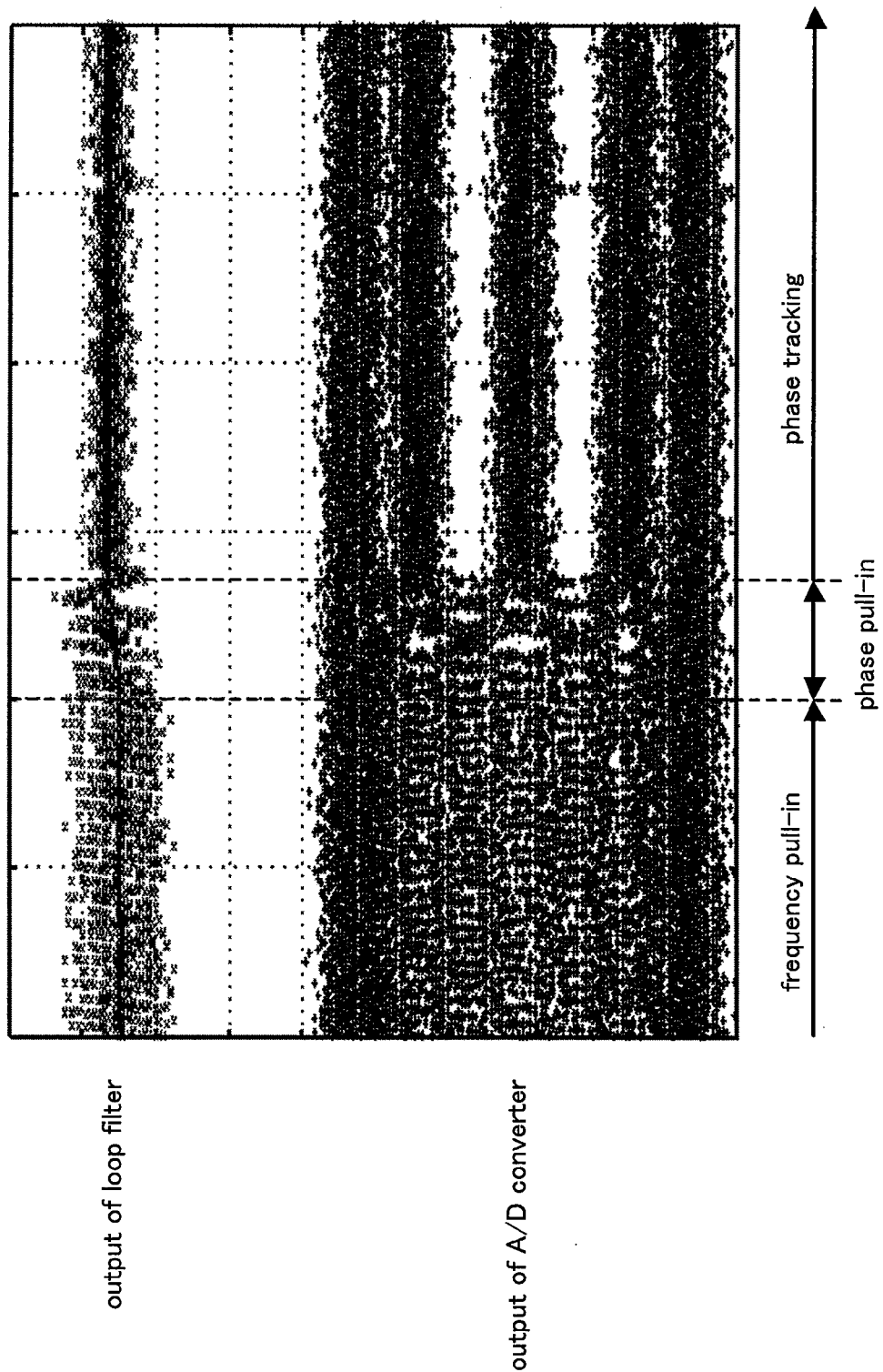
FIG. 22 is a timing chart showing A/D conversion by an A/D converter when a conventional feedback timing extractor performs from frequency pull-in to phase pull-in to phase tracking.
Figure 23:
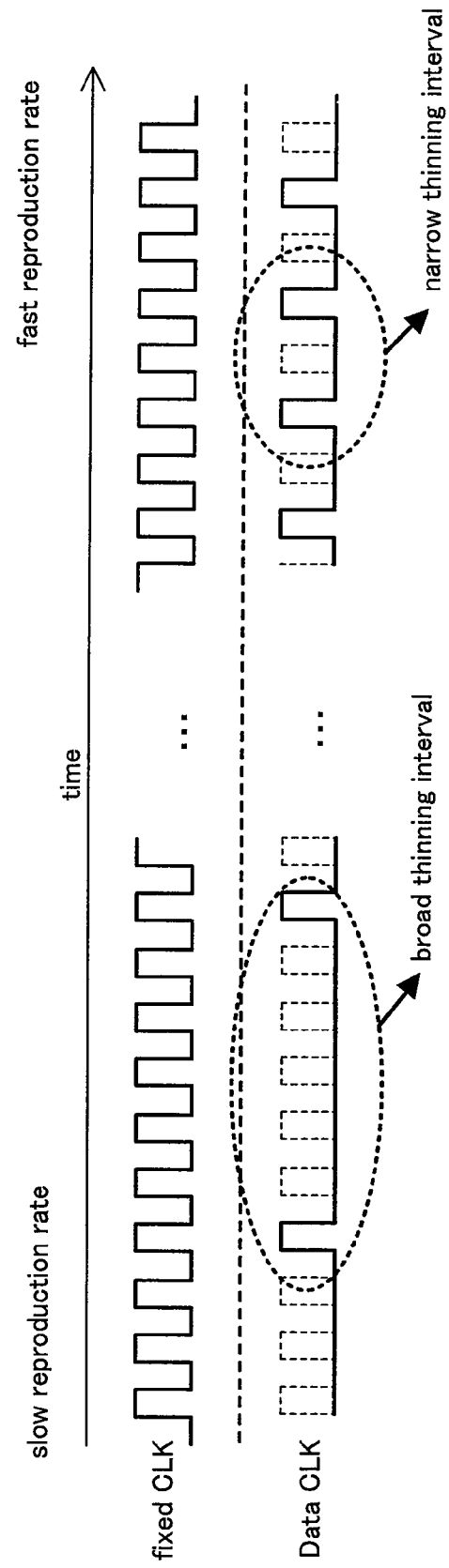
FIG. 23 is a timing chart showing changes in pseudo-synchronous clock when a reproduction speed varies, in a conventional feedforward timing extractor.

FIGS. 17 to 19 are block diagrams showing a variation of the reproduced signal processor of the first embodiment of the present invention.

In FIG. 17, a waveform equalizer (equalization circuit) 9 is connected to the output side of an A/D converter 2 in the reproduced signal processor of FIG. 1. The waveform equalizer 9 performs waveform equalization by boosting a signal component within a high-frequency band having a low amplitude value of the frequency band of an input reproduced signal as shown in FIG. 18. After the waveform equalizer 9 thus performs waveform equalization with respect to the reproduced signal in a digital region, the waveform-equalized reproduced signal is input to a frequency ratio calculator 3 and a phase correction amount calculator 4, and the reproduced signal is then processed as described above.

FIG. 19 is a block diagram schematically showing a whole configuration of an information reproduction apparatus including an LSI including the reproduced signal processor of the present invention. For example, when the information reproduction apparatus is assumed to be a DVD reproduction apparatus or the like, an information recording unit 101 is a recording medium (DVD medium), and an information reading unit 102 is a pickup which reads out recorded data from the recording medium. Reference numeral 103 indicates an LSI including a signal processing circuit which performs waveform equalization, error correction, data demodulation and the like using a reproduced signal waveform read out by the pickup. A display terminal (not shown) performs displaying of information or conversion to audio using decoded data and a clock output by the LSI 103.

Although it has been assumed above that a reproduced signal is input from a recording medium, such as a DVD or the like, the present invention is also applicable to a case where a signal which is supplied via a wireless communication path or a wired communication path, such as an optical fiber, a coaxial cable, a power line path or the like, is an input signal.

Also, in the reproduced signal processor of the present invention, although the modulated data generator 6 and the digital value generator 7 are provided to configure control of setting of a digital value input to the clock generator 1 with hardware as shown in FIG. 1, these units may be configured with software.

INDUSTRIAL APPLICABILITY

As described above, according to the present invention, in a reproduced signal processor having a feedforward control scheme, power consumption of a system can be optimized and control of the system can be facilitated while stability against an increase in clock latency is improved and data synchronization is sped up, and a clock frequency can be finely adjusted while a satisfactory decoding process is maintained, as compared to a feedback control scheme. Therefore, the present invention is useful for an information reproduction apparatus which extracts data or timing information from a reproduced signal, such as an optical disc reproduction system or the like.

The invention claimed is:

1. A reproduced signal processor for extracting recording timings from a reproduced signal, comprising:
    a clock generating circuit for outputting a clock having a frequency corresponding to a set digital value;
    a quantization circuit for quantizing and outputting the reproduced signal at timings of the output clock of the clock generating circuit;
    a frequency ratio calculating circuit for calculating a frequency ratio between a reproduction frequency of the reproduced signal and a frequency of the output clock of the clock generating circuit based on the reproduced signal quantized by the quantization circuit;
    a phase correction value calculating circuit for calculating a phase correction value based on the reproduced signal quantized by the quantization circuit;
    a pseudo-synchronous clock generating circuit for generating a pseudo-synchronous clock pseudo-synchronous with the recording timings and a phase of the pseudo-synchronous clock, depending on the frequency ratio calculated by the frequency ratio calculating circuit and the phase correction value calculated by the phase correction amount calculating circuit; and
    a modulation circuit for generating a modulation component using the output clock of the clock generating circuit and updating the set digital value with the modulation component, when the frequency ratio of the frequency ratio calculating circuit satisfies a preset condition.

2. The reproduced signal processor of claim 1, wherein the modulation circuit generates the modulation component so that the set digital value gradually varies, when the frequency ratio of the frequency ratio calculating circuit satisfies the preset condition.

3. The reproduced signal processor of claim 1, comprising:
    an equalization circuit provided between the quantization circuit and the frequency ratio calculating circuit, for equalizing the reproduced signal quantized by the quantization circuit,
    wherein the reproduced signal equalized by the equalization circuit is output to the frequency ratio calculating circuit.

4. The reproduced signal processor of claim 1, wherein the frequency ratio calculating circuit measures a specific pattern contained in an output sequence of the quantization circuit, an appearance interval of the specific pattern, or both thereof based on the output clock of the clock generating circuit, and calculates the frequency ratio between the reproduction frequency of the reproduced signal and the frequency of the output clock of the clock generating circuit based on the measured value.

5. The reproduced signal processor of claim 1, wherein the preset condition is determined by comparing a value of the frequency ratio with a predetermined value after frequency lock in which the frequency ratio is stable is detected based on the frequency ratio.

6. The reproduced signal processor of claim 1, wherein the preset condition is determined by determining whether or not a value of the frequency ratio falls within a predetermined range after frequency lock in which the frequency ratio is stable is detected based on the frequency ratio.

7. The reproduced signal processor of claim 1, wherein a modulation rate of the modulation circuit is set, depending on the set digital value.

8. The reproduced signal processor of claim 5, wherein the frequency lock is detected based on a variation in output of the frequency ratio calculating circuit.

9. The reproduced signal processor of claim 1, wherein when frequency lock in which the frequency ratio is stable is not detected, then if the frequency of the output clock of the clock generating circuit is lower than the reproduction frequency of the reproduced signal, the set digital value is set and controlled to a value corresponding to the frequency ratio of the frequency ratio calculating circuit or a value obtained by adding a predetermined offset to the value corresponding to the frequency ratio so that the frequency of the output clock of the clock generating circuit becomes higher than the reproduction frequency of the reproduced signal.

10. The reproduced signal processor of claim 1, wherein when frequency lock in which the frequency ratio is stable is no longer detected during reproduction, then if a ratio of the frequency of the output clock of the clock generating circuit to the reproduction frequency of the reproduced signal is higher than a preset range, the set digital value is set and controlled to the frequency ratio of the frequency ratio calculator, or a value obtained by subtracting a predetermined offset from a value corresponding to the frequency ratio so that the ratio of the frequency of the output clock of the clock generating circuit to the reproduction frequency of the reproduced signal falls within the preset range.

11. The reproduced signal processor of claim 1, wherein the modulation circuit holds a value of the modulation component to be generated, when frequency lock in which the frequency ratio is stable is no longer detected during reproduction.

12. The reproduced signal processor of claim 1, wherein the clock generating circuit includes a combination of a D/A converter and a voltage controlled oscillator, or a current control oscillator.

13. A video display comprising:
an LSI having the reproduced signal processor of claim 1 and a signal processing circuit for decoding a received signal containing audio data and video data based on a result obtained by the reproduced signal processor; and
a display terminal for receiving the decoded signal from the LSI and generating the decoded audio data and displaying the decoded video data.

14. The reproduced signal processor of claim 1, wherein the reproduced signal is supplied via a wireless communication path or a communication path including an optical fiber, a coaxial cable or a power line.

15. The reproduced signal processor of claim 1, wherein the reproduced signal is supplied from an optical disc including a DVD disc, a CD disc or a Blu-ray disc.

* * * * *